US011107771B2

(12) United States Patent
Chun et al.

(10) Patent No.: US 11,107,771 B2
(45) Date of Patent: Aug. 31, 2021

(54) SEGREGATED POWER AND GROUND DESIGN FOR YIELD IMPROVEMENT

(71) Applicant: Taiwan Semiconductor Manufacturing Company, Ltd., Hsinchu (TW)

(72) Inventors: Shu-Rong Chun, Hsinchu (TW); Tin-Hao Kuo, Hsinchu (TW); Chi-Hui Lai, Taichung (TW); Kuo Lung Pan, Hsinchu (TW); Yu-Chia Lai, Zhunan Township (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/727,276

(22) Filed: Dec. 26, 2019

(65) Prior Publication Data

US 2021/0202391 A1    Jul. 1, 2021

(51) Int. Cl.
*H01L 23/538* (2006.01)
*H01L 23/31* (2006.01)
*H01L 21/683* (2006.01)
*H01L 21/48* (2006.01)
*H01L 21/56* (2006.01)

(52) U.S. Cl.
CPC ...... *H01L 23/5386* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 2221/68372* (2013.01)

(58) Field of Classification Search
CPC ............ H01L 23/5386; H01L 23/5383; H01L 21/4857; H01L 21/565; H01L 21/568; H01L 21/6835; H01L 21/4853; H01L 23/3128; H01L 2221/68372
USPC ...................................................... 257/668
See application file for complete search history.

(56) References Cited

U.S. PATENT DOCUMENTS

| 10,103,124 B2 * | 10/2018 | Kawaminami ....... H01L 23/481 |
| 10,396,053 B2 * | 8/2019 | Fillion .................... H01L 24/06 |
| 2019/0157208 A1 | 5/2019 | Lin et al. |

(Continued)

FOREIGN PATENT DOCUMENTS

DE    102018109028 A1    1/2019

*Primary Examiner* — Vu A Vu
(74) *Attorney, Agent, or Firm* — Slater Matsil, LLP

(57) ABSTRACT

A method includes encapsulating a plurality of package components in an encapsulant, and forming a first plurality of redistribution layers over and electrically coupling to the plurality of package components. The first plurality of redistribution layers have a plurality of power/ground pad stacks, with each of the plurality of power/ground pad stacks having a pad in each of the first plurality of redistribution layers. The plurality of power/ground pad stacks include a plurality of power pad stacks, and a plurality of ground pad stacks. At least one second redistribution layer is formed over the first plurality of redistribution layers. The second redistribution layer(s) include power lines and electrical grounding lines electrically connecting to the plurality of power/ground pad stacks.

19 Claims, 30 Drawing Sheets

(56) References Cited

U.S. PATENT DOCUMENTS

2019/0157226 A1  5/2019  Fillion et al.
2019/0157233 A1  5/2019  Fillion et al.

\* cited by examiner

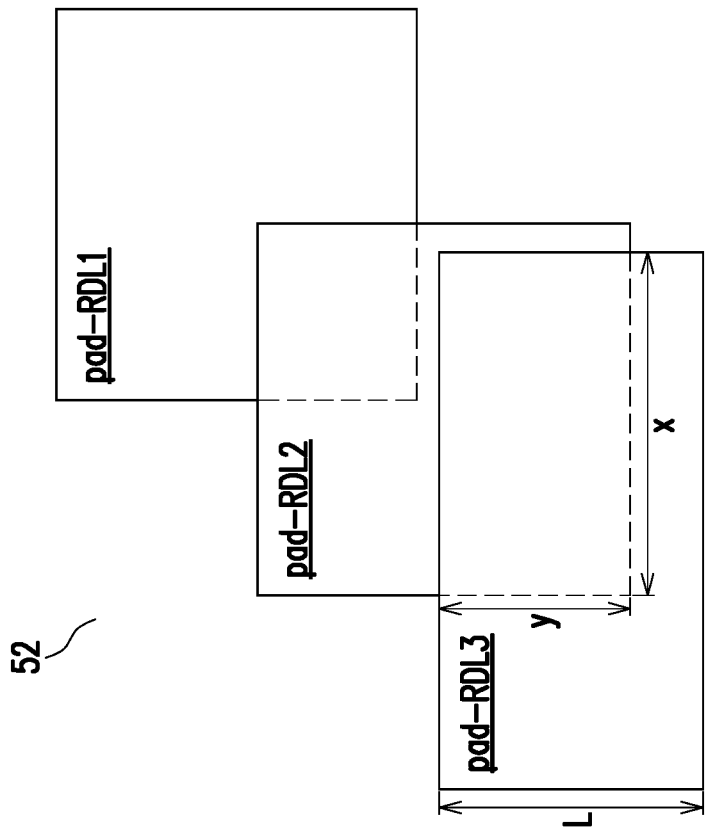
FIG. 25
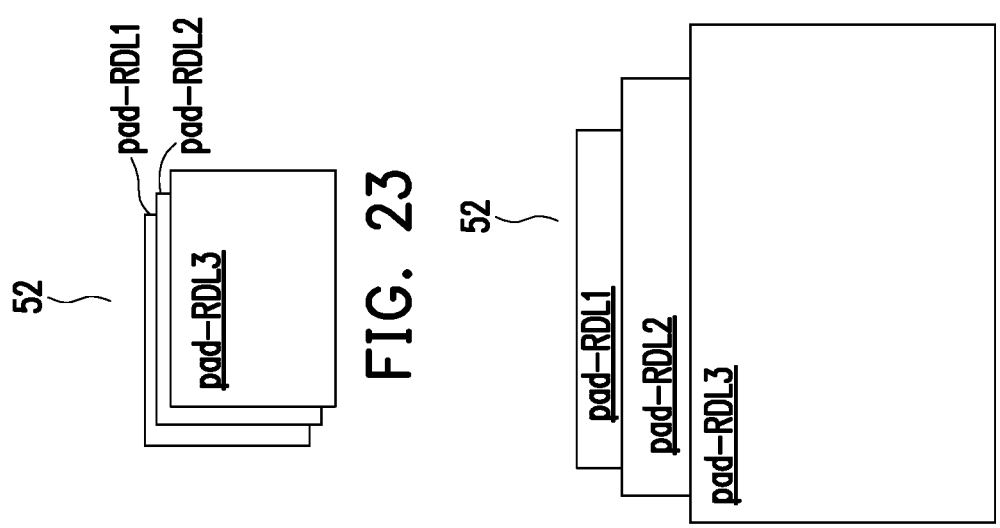
FIG. 23
FIG. 24

SEGREGATED POWER AND GROUND DESIGN FOR YIELD IMPROVEMENT

BACKGROUND

In recent years, high-performance computing applications are gaining interests. The high-performance computing applications may include a plurality of core devices integrated to a same wafer. New issues have been found in the manufacture of the high-performance computing applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 23, 24, and 25 illustrate the power pads with different sizes and shapes in power pad stacks in accordance with some embodiments.

DETAILED DESCRIPTION

Figure 1:
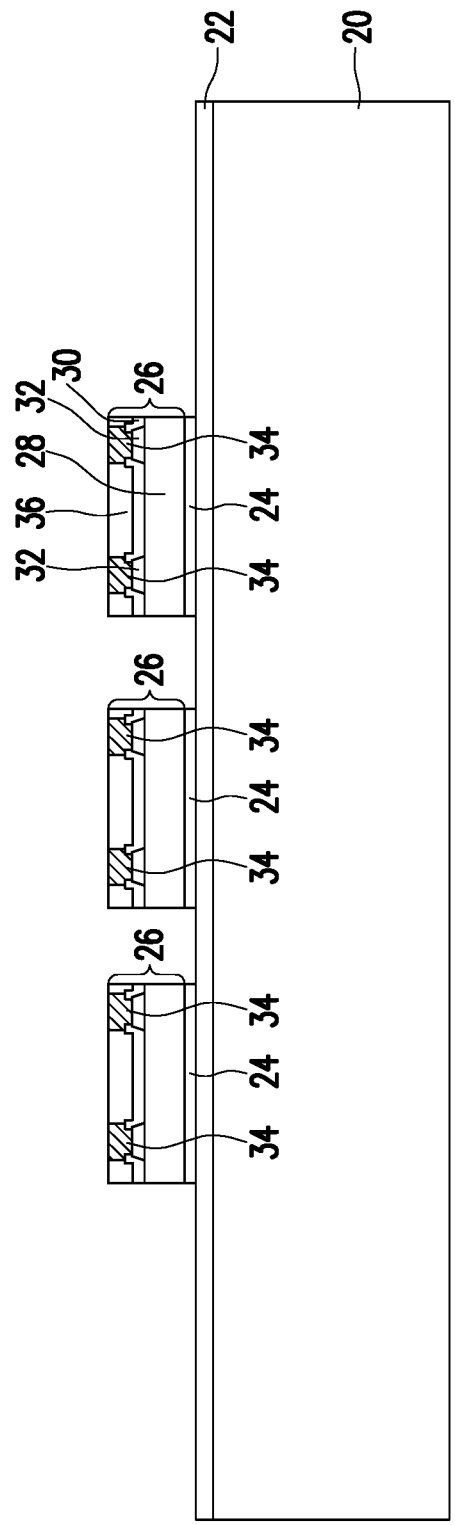
FIGS. 1 through 13 illustrate the cross-sectional views of intermediate stages in the formation of a reconstructed wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A power and ground redistribution structure (which may be used in a high-performance computing package) and the method of forming the same are provided in accordance with some embodiments. The intermediate stages in the formation of the high-performance computing package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, the reconstructed wafer includes lower redistribution layers and upper redistribution layers. The power pads in the lower redistribution layers form power pad stacks, with the power pads in neighboring power pad stacks having no overlap. The electrical shorting between neighboring power pad stacks is thus reduced.

Figure 40:
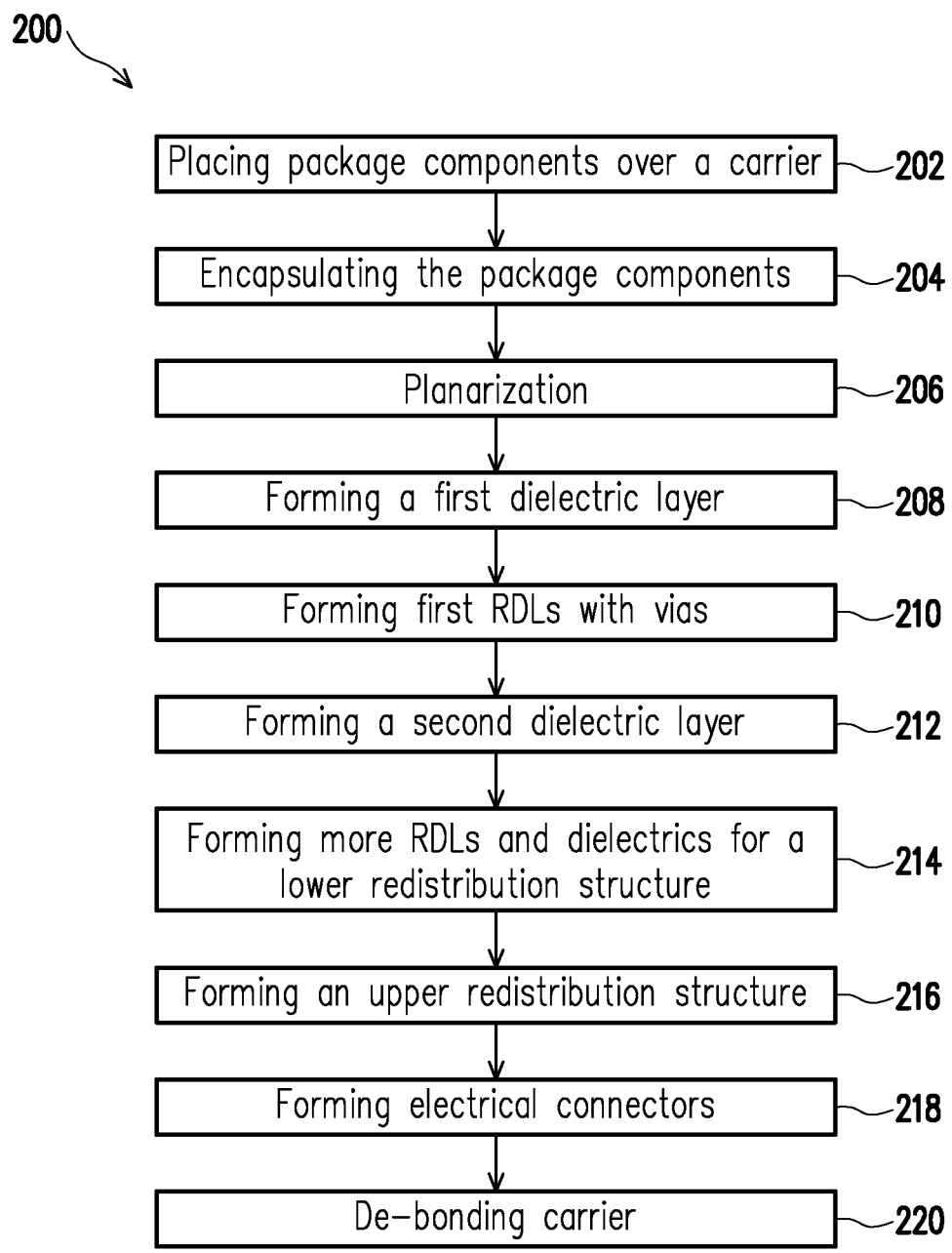
FIG. 40 illustrates a process flow for forming a reconstructed wafer in accordance with some embodiments.

FIGS. 1 through 13 illustrate the cross-sectional views of intermediate stages in the formation of a reconstructed wafer in accordance with some embodiments of the present disclosure. The reconstructed wafer may include a high-performance computing package in accordance with some embodiments. The corresponding processes are also reflected schematically in the process flow shown in FIG. 40.

Referring to FIG. 1, carrier 20 is provided, and release film 22 is formed on carrier 20. Carrier 20 is formed of a transparent material, and may be a glass carrier, a ceramic carrier, an organic carrier, or the like. Release film 22 is in physical contact with the top surface of carrier 20. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/radiation (such as a laser beam), and can release carrier 20 from the structure placed and formed thereon. In accordance with some embodiments, a dielectric buffer layer (not shown) is formed over release film 22. The dielectric buffer layer may be formed of a polymer such as polybenzoxazole (PBO), polyimide, benzocyclobutene (BCB), or another applicable polymer. In accordance with alternative embodiments, the dielectric buffer layer is omitted.

Package components 26 are then placed over release film 22, for example, through Die-Attach Films (DAFs) 24. The respective process is illustrated as process 202 in the process flow 200 in FIG. 40. Package components 26 may include device dies (such as core device dies and Input/output (IO) dies) and packages with device dies therein. The device dies may include semiconductor substrates and integrated circuit devices (such as active devices, which include transistors, for example, not shown) at the front surface (the surface facing up) of the respective semiconductor substrates. The semiconductor substrates, integrated circuit devices, and the interconnect structures are represented as parts 28. In accordance with some embodiments of the present disclosure, package components 26 may include logic dies, which may include Central Processing Unit (CPU) dies, Graphic Processing Unit (GPU) dies, mobile application dies, Micro Control Unit (MCU) dies, BaseBand (BB) dies, Application processor (AP) dies, Field-Programmable Gate Array (FPGA) dies, Application-Specific Integrated Circuit (ASIC) dies, and/or the like. Package components 26 may also include memory dies, input-output (IO) dies, or the like. The memory dies may include High-Bandwidth Memory (HBM) stacks, Hybrid Memory Cubes (HMC), Dynamic Random Access Memory (DRAM) dies, Static Random Access Memory (SRAM) dies, or the like. Package components 26 may also include system packages, with a system package including a plurality of packages integrated as a system. The corresponding package components 26 are sometimes referred to as System-on-Chip (SoC) dies.

Over parts 28 of package components 26, there may be metal pads 32. In accordance with some embodiments, metal pads 32 are formed of aluminum copper, copper, nickel, aluminum, or the like. The edge portions of the metal pads may be covered by passivation layers 30, which may be formed of or comprise silicon oxide, silicon nitride, Undoped silicate glass, composite layers thereof, or the like.

Electrical connectors 34 may be formed over metal pads 32, with the lower portions of electrical connectors 34 penetrating through passivation layer 30 to contact metal pads 32 in accordance with some embodiments. Electrical connectors 34 are electrically connected to the integrated circuit devices in package components 26. Electrical connectors 34 may be formed of metal pillars (or metal pads). Electrical connectors 34 may include some connectors for providing power (such as providing VDD), some connectors for electrical grounding (VSS), some connectors for signal routing, and the like. In accordance with some embodiments of the present disclosure, protection layer 36 is formed to cover electrical connectors 34, with some portions of protection layer 36 covering electrical connectors 34. Protection layer 36 may be formed of a polymer, which may comprise PBO, polyimide, BCB, or the like.

Figure 2:
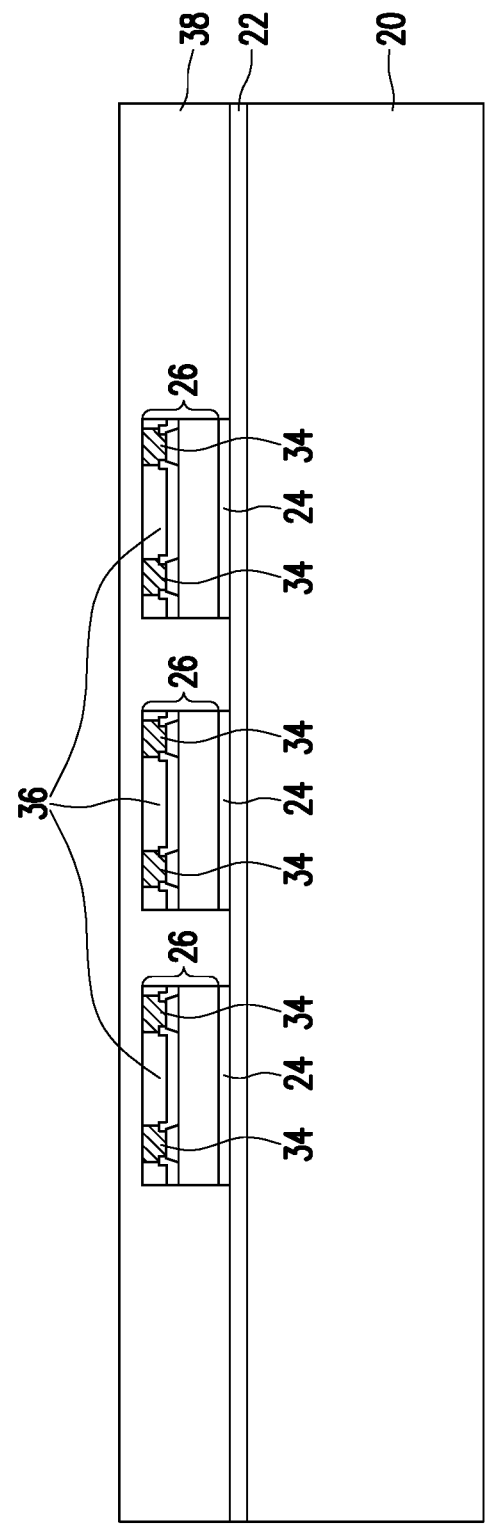

Referring to FIG. 2, encapsulant 38 is dispensed to encapsulate package components 26, and to fill the gaps between package components 26. The respective process is illustrated as process 204 in the process flow 200 in FIG. 40. Encapsulant 38 is disposed in a flowable form, and is then cured into a solid form. Encapsulant 38 may include a molding compound, a molding underfill, an epoxy, and/or resin. When formed of molding compound or molding underfill, encapsulant 38 may include a base material, which may be a polymer, a resin, an epoxy, or the like, and filler particles (not shown) in the base material. The filler particles may be dielectric particles of $SiO_2$, $Al_2O_3$, silica, or the like, and may have spherical shapes. Also, the spherical filler particles may have the same or different diameters. Encapsulant 38 is dispensed to a level so that the top surface of encapsulant 38 is higher than the top ends of electrical connectors 34 and protection layers 36 in package components 26.

Figure 3:
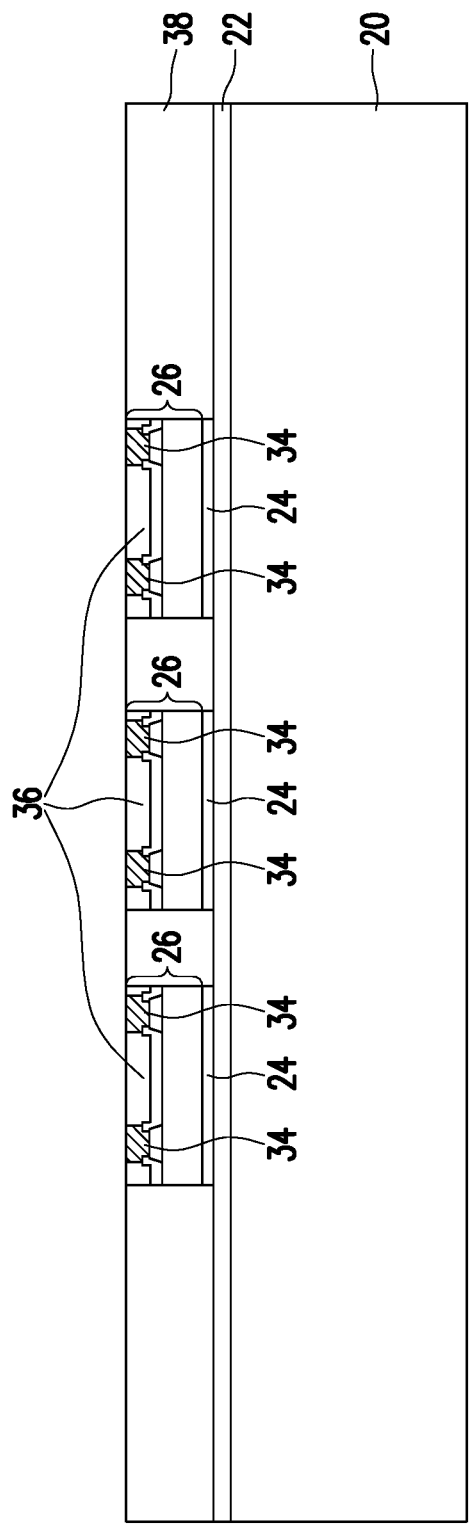

Subsequent to the dispensing of encapsulant 38, as also shown in FIG. 3, a planarization process such as a Chemical Mechanical Polish (CMP) process or a mechanical grinding process is performed to planarize encapsulant 38, protection layers 36, and electrical connectors 34 of package components 26. The respective process is illustrated as process 206 in the process flow 200 in FIG. 40. As a result, the electrical connectors 34 of package components 26 are exposed.

Figure 4:
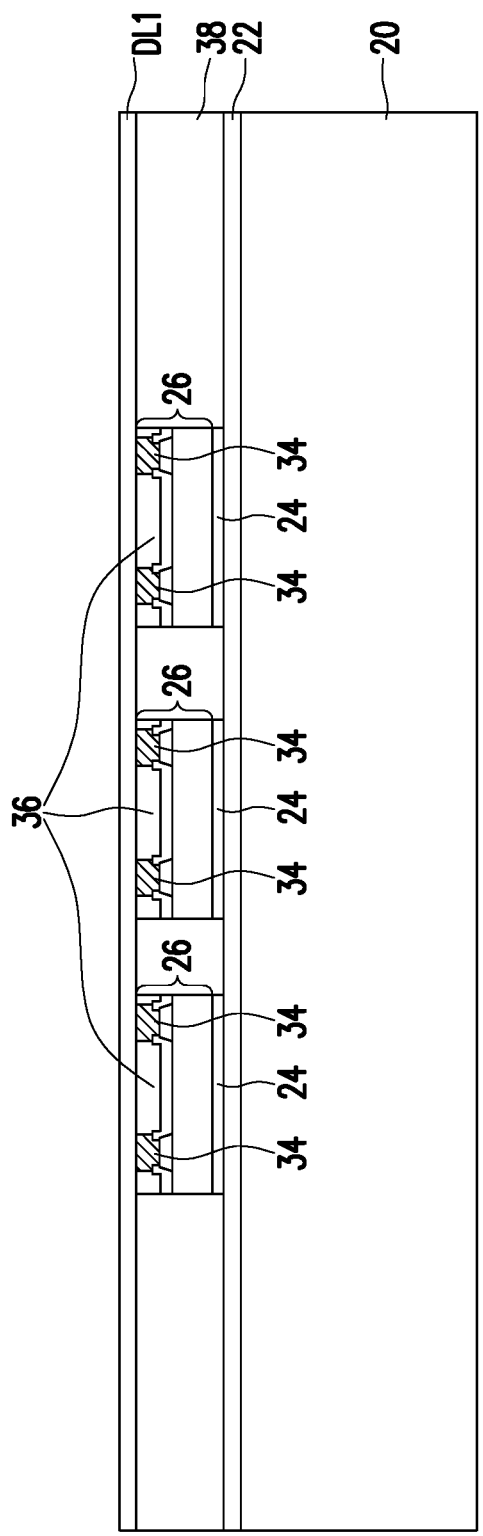

In subsequent processes, redistribution structure 50 (FIG. 11) is formed over encapsulant 38, and the respective processes are shown in FIGS. 4 through 11. FIGS. 4 through 7 illustrate the formation of a lower redistribution structure 50A in accordance with some embodiments. Referring to FIG. 4, dielectric layer DL1 is formed. The respective process is illustrated as process 208 in the process flow 200 in FIG. 40. Dielectric layer DL1 may be formed using a polymer, which is dispensed in a flowable form, and is then cured. In accordance with some embodiments, dielectric layer DL1 is formed of PBO, polyimide, BCB, or the like.

Figure 5:
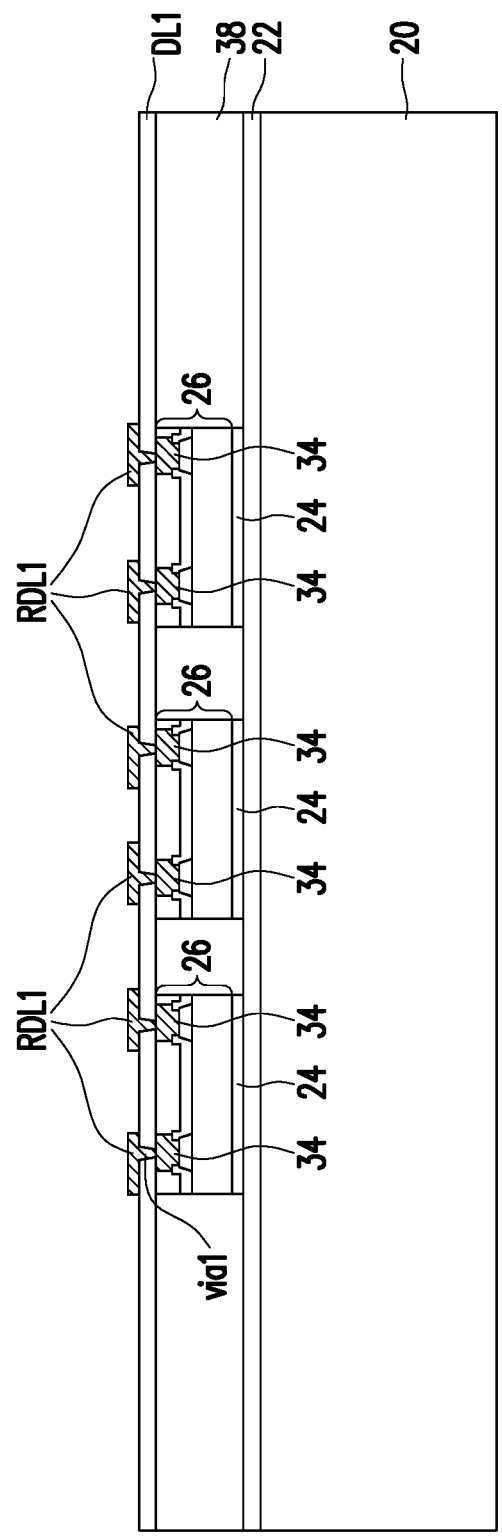

Referring to FIG. 5, redistribution line (RDL) layer RDL1 is formed, which includes metal lines and pads. Throughout the description, the term "RDL layer" is used to refer to the conductive features such as metal lines and pads in a same layer collectively, and does not including vias. Accordingly, RDL layer RDL1 includes the portions of the redistribution lines over dielectric layer DL1. Vias via1 are also formed to extend into dielectric layer DL1 and electrically connect RDL layer RDL1 to package components 26. The respective processes are illustrated as process 210 in the process flow 200 in FIG. 40. In accordance with some embodiments, the formation processes include patterning dielectric layer DL1 to form openings, through which electrical connectors 34 of package components 26 are revealed, depositing a metal seed layer, forming a plating mask (such as a photo resist) over the metal seed layer, patterning the plating mask, performing a plating process to form RDL layer RDL1 and vias via1, removing the plating mask, and then removing the portions of the metal seed layer directly underlying the removed plating mask. The remaining portions of the metal seed layer are also considered as parts of the RDL layer RDL1 and vias via1. The metal seed layer may include a copper layer, or may include a composite layer including a titanium layer and a copper layer over the titanium layer, or the like. The plated material may include copper or a copper alloy, for example.

Figure 6:
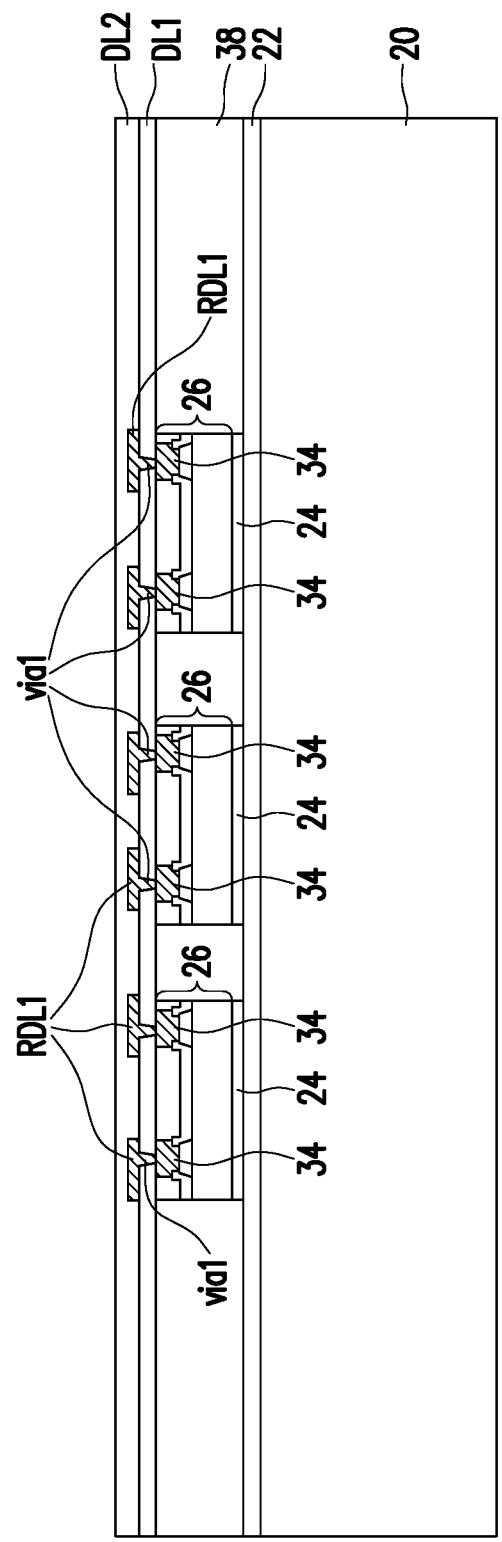
Figure 7:
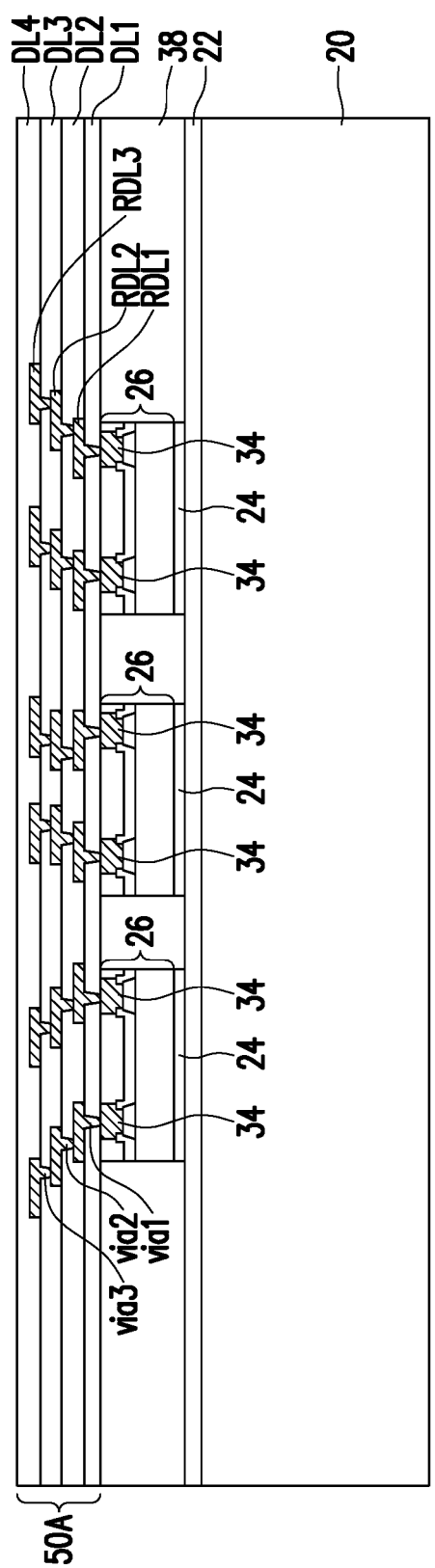

FIG. 6 illustrates the formation of dielectric layer DL2, which may be formed using a material selected from the same group of candidate materials for forming dielectric layer DL1. The respective process is illustrated as process 212 in the process flow 200 in FIG. 40. In subsequent processes, as shown in FIG. 7, RDL layers RDL2 and RDL3, vias via2 and via3, and dielectric layers DL3 and DL4 are formed. The respective process is illustrated as process 214 in the process flow 200 in FIG. 40. The materials and the formation processes of RDL layers RDL2 and RDL3 and vias via2 and via3 may be similar to the material and the formation process, respectively, of RDL layer RDL1 and vias via1. The materials and the formation processes of dielectric layers DL3 and DL4 may be similar to the material and the formation process, respectively, of dielectric layer DL2. For example, dielectric layers DL3 and DL4 may be formed of polyimide, PBO, BCB, or the like. The details are thus not repeated herein. Lower redistribution structure 50A, which includes RDLs RDL1, RDL2, and RDL3, vias via1, via2, and via3, and dielectric layers DL1, DL2, DL3, and DL4, is thus formed. It is appreciated that although in the discussed example, the lower redistribution structure 50A has three RDL layers, the number of RDL layers in the lower redistribution structure 50A may be two, four, five, or more in accordance with some embodiments.

Figure 8:
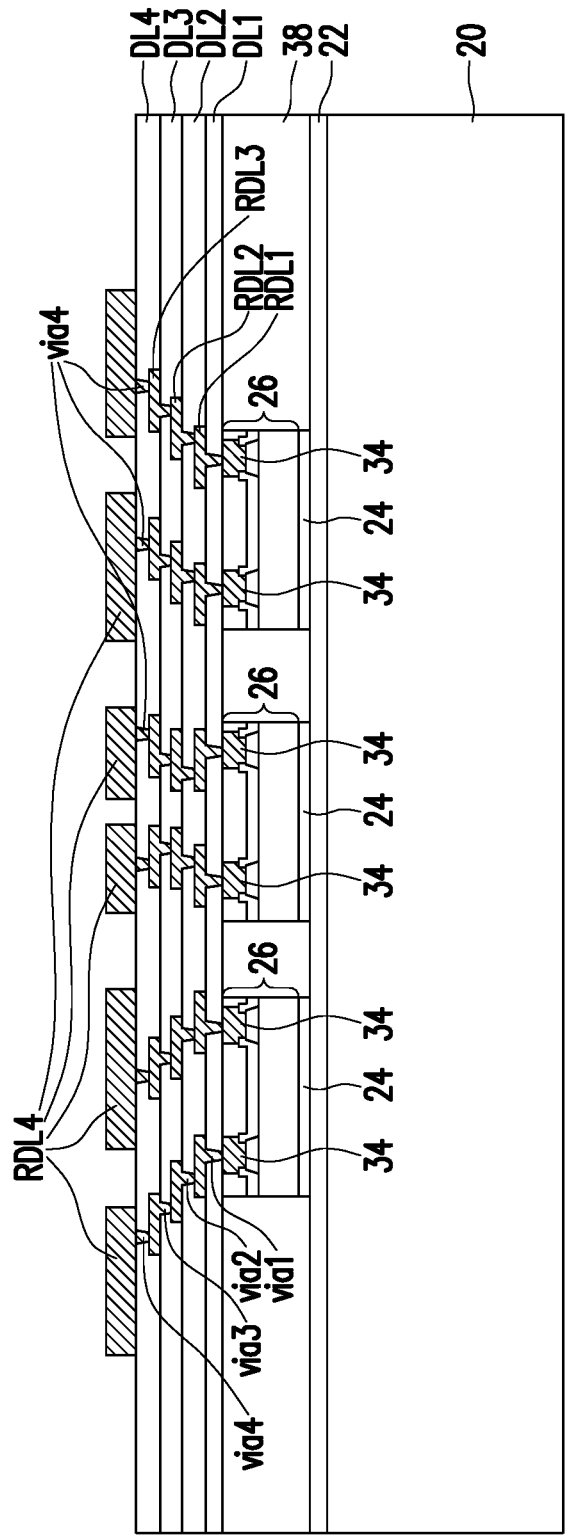

FIGS. 8 through 11 illustrate the formation of an upper redistribution structure 50B (FIG. 11) in accordance with some embodiments. The respective process is illustrated as process 216 in the process flow 200 in FIG. 40. Referring to FIG. 8, RDL layer RDL4 and vias via4 are formed. The material and the formation process of RDL layer RDL4 and vias via4 may be similar to the material and the formation process, respectively, of RDL layer RDL1 and vias via1. RDL layer RDL4 may also include metal lines and pads over dielectric layer DL4. Vias via4 extend into dielectric layer DL4 to contact the metal lines and pads in RDL layer RDL3.

Figure 9:
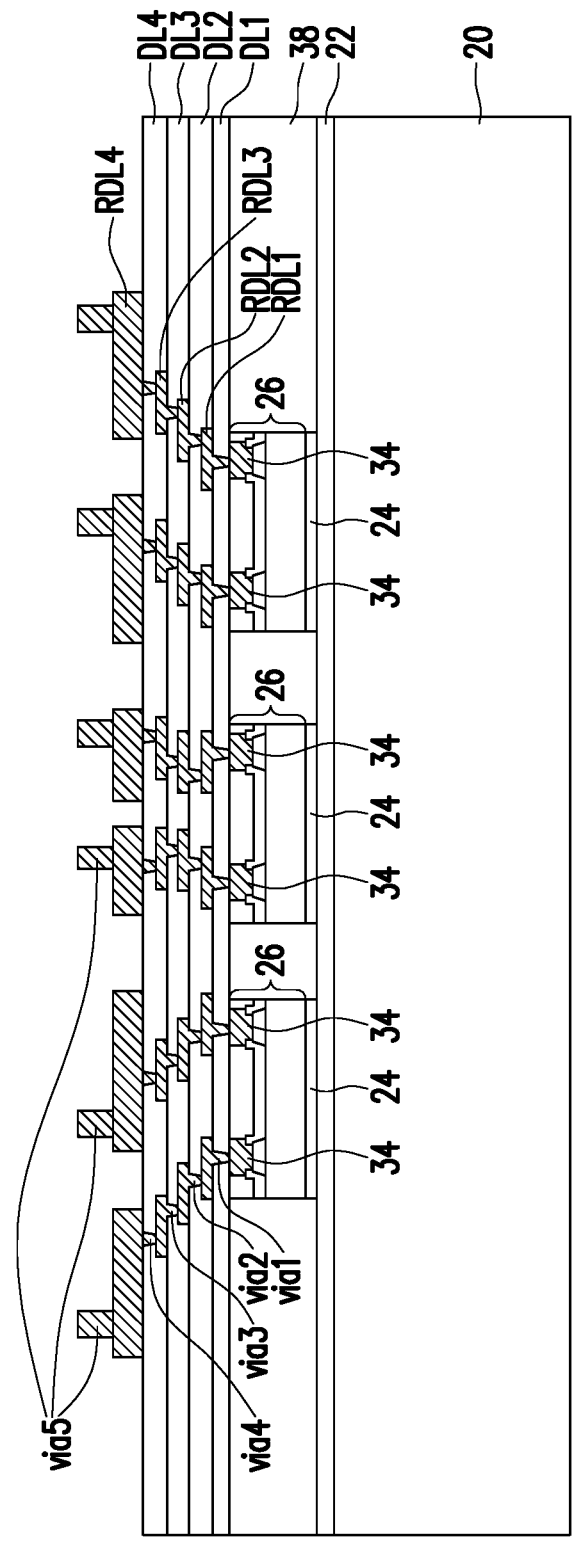

Next, as shown in FIG. 9, vias via5 are formed. In accordance with some embodiments, the formation of vias via5 is performed using essentially the same process as for forming RDL layer RDL1. In accordance with alternative embodiments, the formation of vias via5 is performed sharing a same metal seed layer as RDL layer RDL4. The formation process of vias via5 thus may be performed after the plating mask (not shown) for forming RDL layer RDL4 is removed, but before the exposed portions of the metal seed layer for forming RDL layer RDL4 are etched. The formation process of vias via5 may include forming a plating mask covering the plated RDL layer RDL4 and the un-etched metal seed layer, patterning the plating mask to expose some portions of RDL layer RDL4, plating the vias via5 in the openings in the plating mask, removing the plating mask, and then etching the portions of the metal seed layer not covered by RDL layer RDL4.

Figure 10:
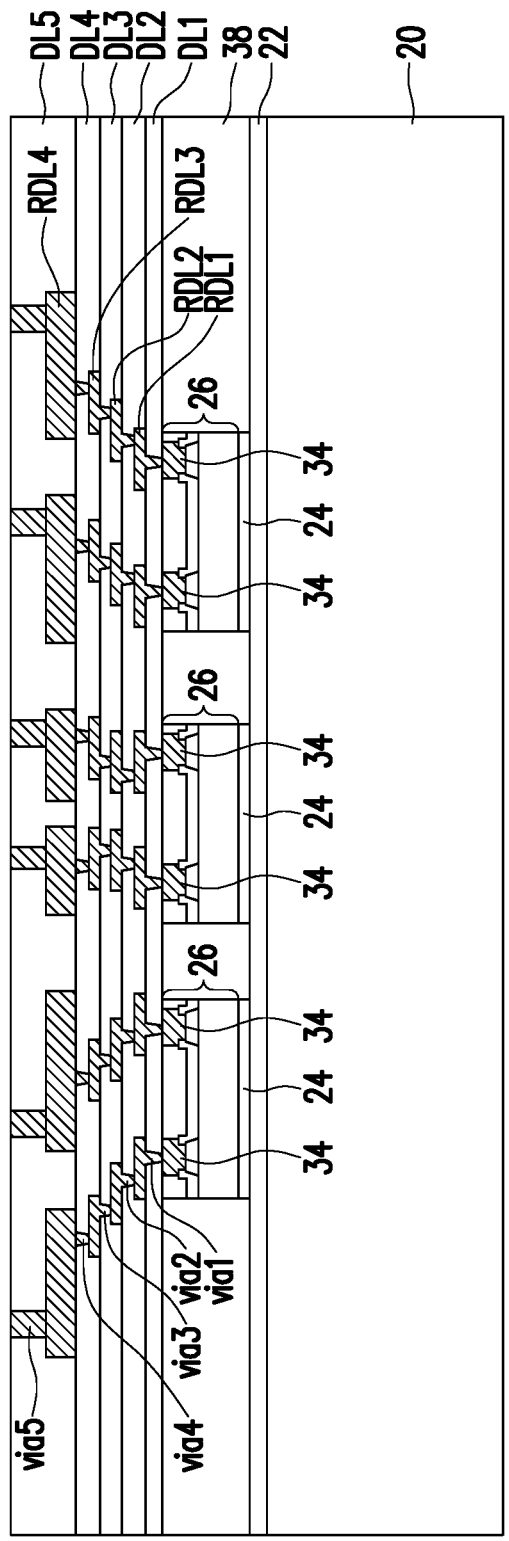

Referring to FIG. 10, dielectric layer DL5 is formed. In accordance with some embodiments, dielectric layer DL5 is formed of molding compound, molding underfill, an epoxy, a resin, or the like, and the formation process include dispensing dielectric layer DL5 in a flowable form, and then curing dielectric layer DL5. A planarization process is performed to planarize the top surfaces of vias via5 and dielectric layer DL5. Vias via5 are thus revealed.

Figure 11:
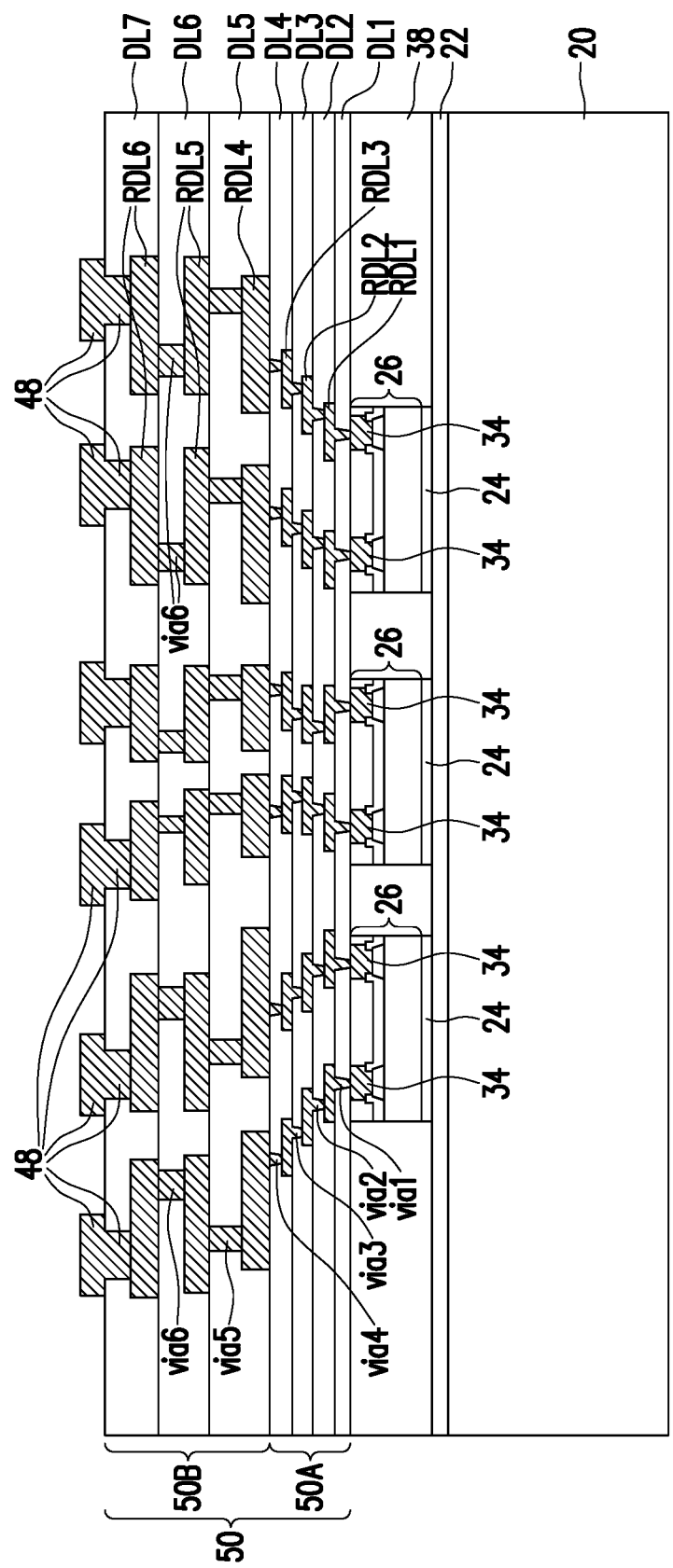

FIG. 11 illustrates the formation of RDL layers RDL5 and RDL6, vias via6, and dielectric layers DL6 and DL7 in accordance with some embodiments of the present disclosure. The materials and the formation processes of RDL5 and RDL6 and vias via6 may be similar to the material and the formation process, respectively, of RDL layer RDL4 and vias via5. The materials and the formation processes of dielectric layers DL6 and DL7 may be similar to the material and the formation process, respectively, of dielectric layer DL5. For example, dielectric layer DL6 and DL7 may be formed of molding compounds, molding underfills, epoxies, resins, or the like. The formation processes may also include dispensing, curing and planarization processes. It is appreciated that although the three RDL layers DL5, DL6, and DL7 are used as an example, the number of RDL layers in the upper redistribution structure may be two, four, five, or more in accordance with some embodiments. In a subsequent process, conductive features 48, which may be Under-Bump Metallurgies (UBMs), may be formed.

Redistribution structure 50 is thus formed through the processes as shown in FIGS. 4 through 11. In accordance with some embodiments, redistribution structure 50 includes lower redistribution structure 50A and upper redistribution structure 50B. The dielectric layers DL5, DL6, and DL7 in upper redistribution structure 50B may be thicker than any of the dielectric layers DL1, DL2, DL3, and DL4 in lower redistribution structure 50A. For example, the thickness of DL5, DL6, and DL7 in upper redistribution structure 50B may be equal to 2 times (or more) the thickness of the dielectric layers DL1, DL2, DL3, and DL4 in lower redistribution structure 50A. The metal lines and pads in upper redistribution structure 50B may also have greater thicknesses, pitches, spacings, etc., than the metal lines and pads in the lower redistribution structure 50A. In accordance with some embodiments, the RDLs in the lower redistribution structure 50A may be used for signal routing from package components to IO dies 26B (FIG. 14), and used for connecting to the power lines in the upper redistribution structure 50B. The RDLs in the upper redistribution structure 50B may be used for power routing, and the RDLs in the upper redistribution structure 50B may be connected to power modules. The RDLs in the upper redistribution structure 50B may or may not be used for power routing.

Figure 12:
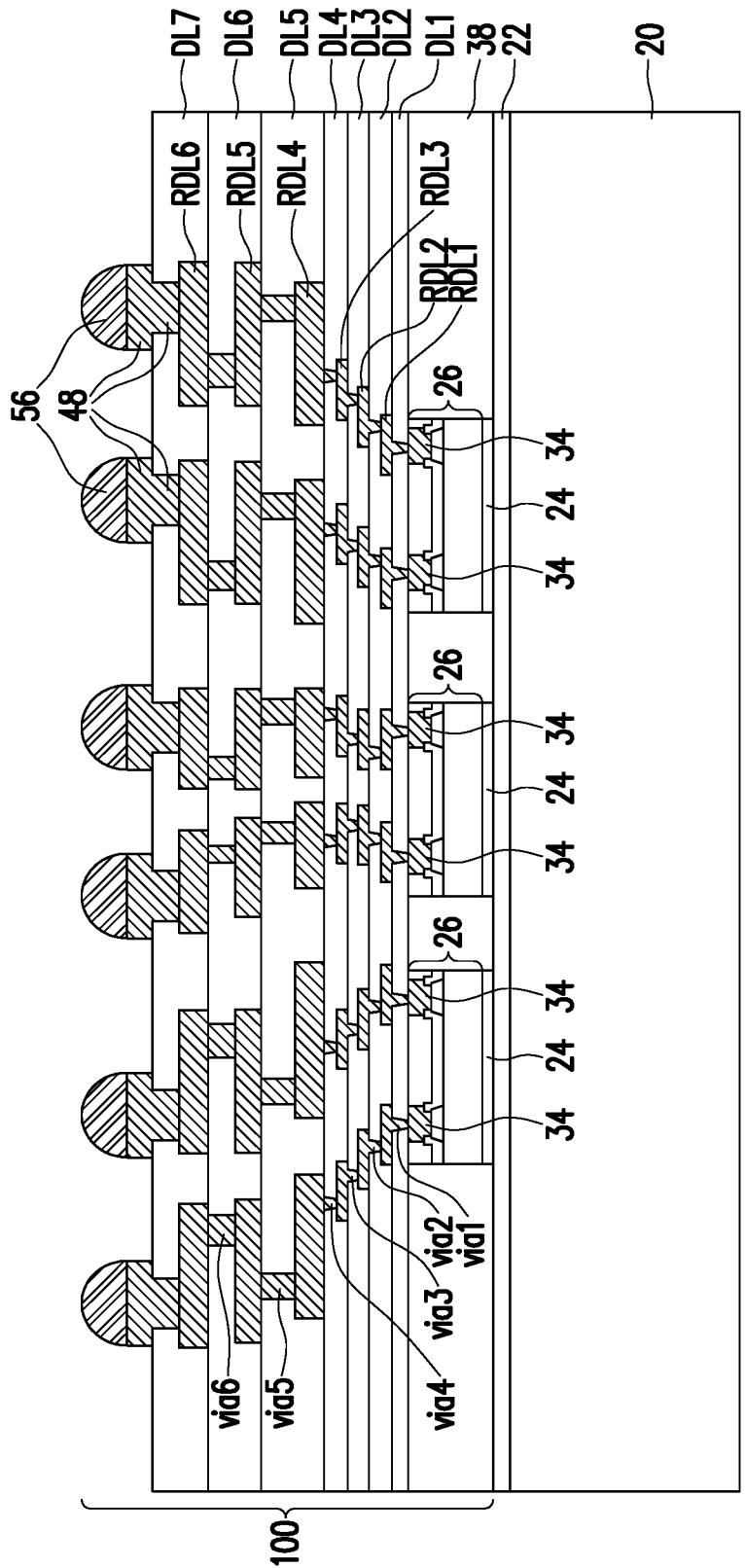

Referring to FIG. 12, electrical connectors 56 are formed on the surface of redistribution structure 50. The respective process is illustrated as process 218 in the process flow 200 in FIG. 40. Electrical connectors 56 and the RDLs in the redistribution structure 50 are electrically connected to package components 26. Throughout the description, the structure over the dielectric buffer layer (or release film 22 if the dielectric buffer layer is not formed) is collectively referred to as reconstructed wafer 100.

Figure 13:
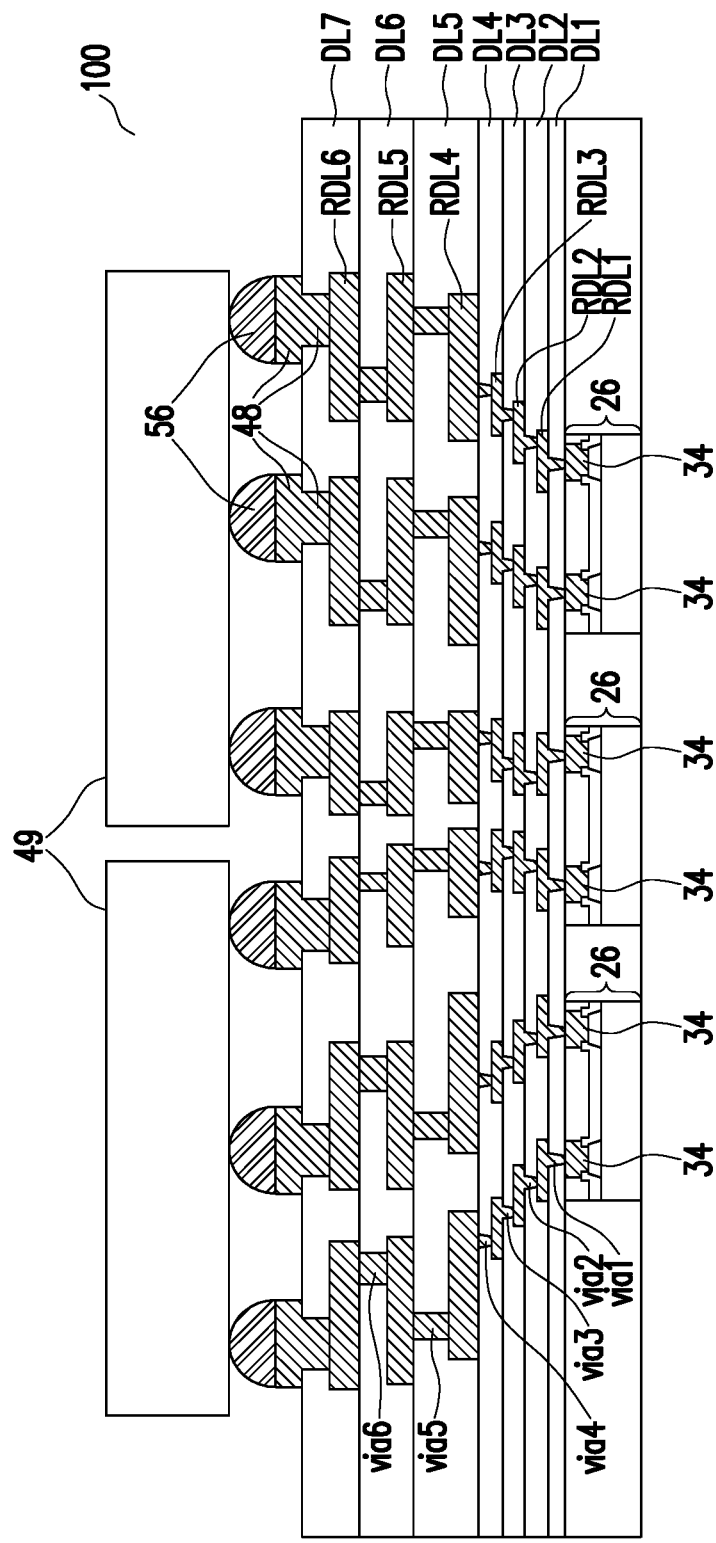
Figure 14:
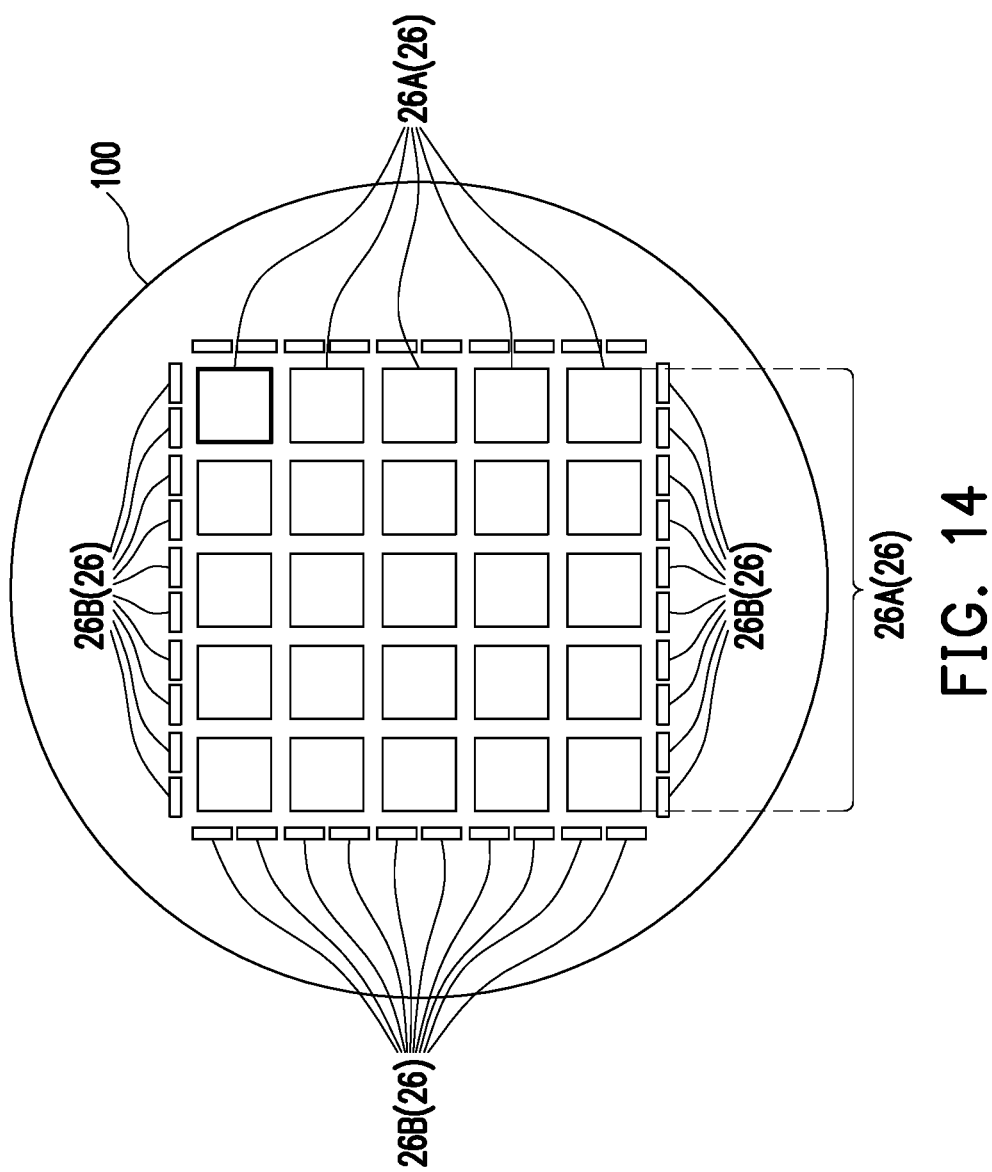
FIG. 14 illustrates a plane view of a reconstructed wafer in accordance with some embodiments.

In a subsequent process, redistribution structure reconstructed wafer 100 is de-bonded from carrier 20, for example, by projecting laser on release film 22 in order to decompose release film 22, so that reconstructed wafer 100 may be separated from carrier 20. The respective process is illustrated as process 220 in the process flow 200 in FIG. 40. In accordance with some embodiments of the present disclosure, DAFs 24 are removed, for example, in a cleaning process or a grinding process. The resulting reconstructed wafer 100 is shown in FIG. 13. In a subsequent process, the reconstructed wafer 100, which may include all of the device dies 26 therein, is bonded to additional package components 49 such as power modules, Integrated Passive Devices (IPDs), and/or the like. For example, the power modules may include Pulse Width Modulation (PWM) circuits for regulating power. In addition, sockets, pins, or the like may be connected to the IO dies 26B (FIG. 14). Reconstructed wafer 100 may not be sawed before bonding to package components 49. Alternatively, non-functional edge parts (which do not include package components therein) of the reconstructed wafer 100 may be trimmed.

FIG. 14 illustrates a plane view of reconstructed wafer 100. The package components 26 are illustrated. In accordance with some embodiments, package components include core package components 26A and IO dies (or packages) 26B. Core package components 26A may be laid out as an array or other repeating layouts such as a beehive pattern. In accordance with some embodiments, the core package components 26A are identical to each other, and have identical structures and identical functions. IO dies 26B may be laid out surrounding the array formed of core package components 26A. There may also be sockets (not shown) in the peripheral region of reconstructed wafer 100.

Figure 15:
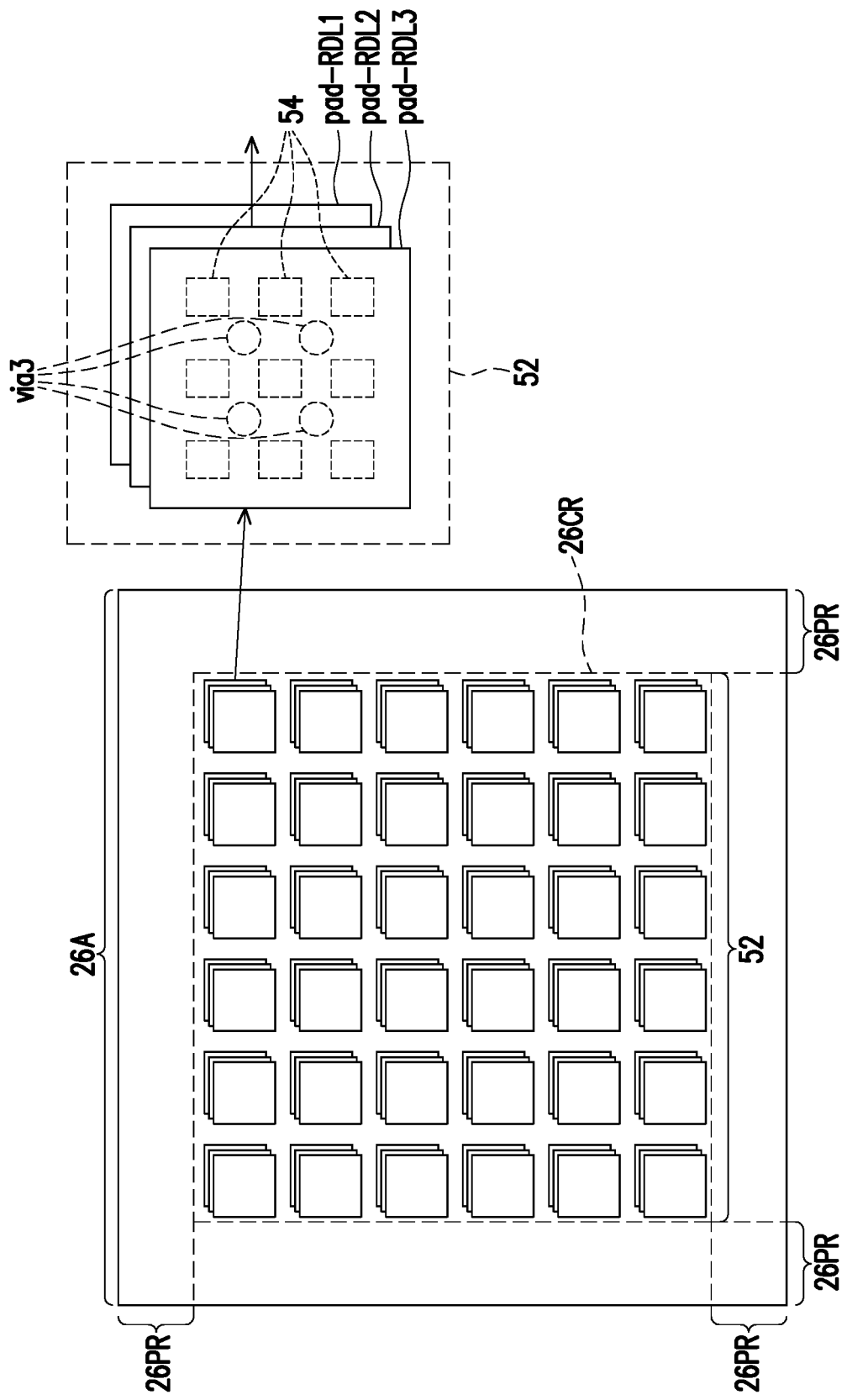
FIG. 15 illustrates a plane view of power pad stacks directly over a package component and a magnified view of an example power pad stack in accordance with some embodiments.

FIG. 15 illustrates the top view of one of core package components 26A, and power/ground pad stacks 52 overlapping a center region 26CR of core package component 26A. Throughout the description, power/ground pad stacks 52 include the power pads for power supply pads such as VDD pads and electrical grounding (such as VSS) pads. If negative power supply voltages are adopted, power/ground pad stacks 52 will also include the power pads for the negative power supply voltages. In addition, there may be some dummy pad stacks, which are electrically floating. Since the dummy pad stacks are used for reducing the pattern-loading effect of other power pad stacks, they are also referred to as power/ground pad stacks 52.

Figure 17:
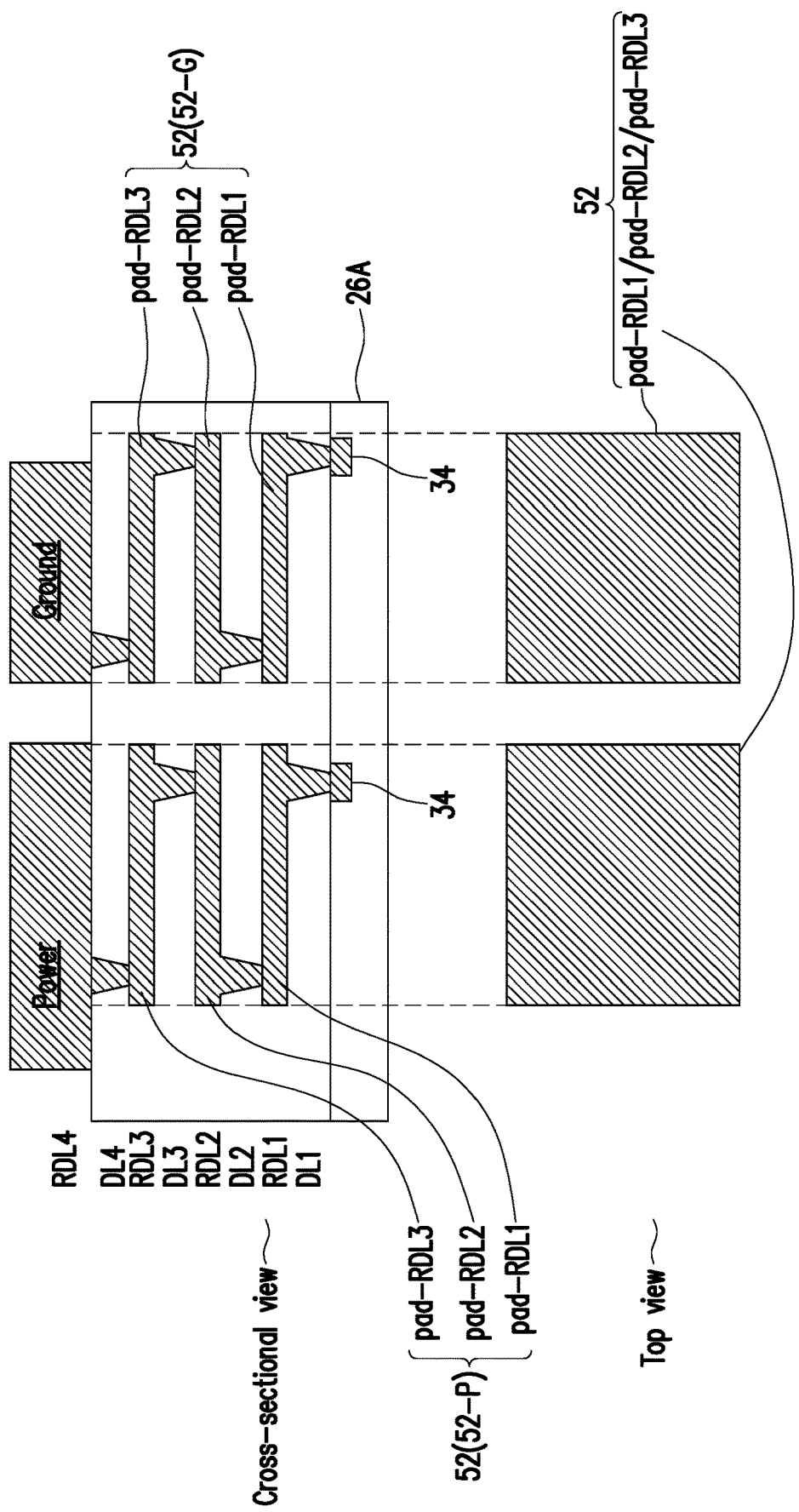
FIG. 17 illustrates overlapped power pads in power pad stacks in accordance with some embodiments.
Figure 18:
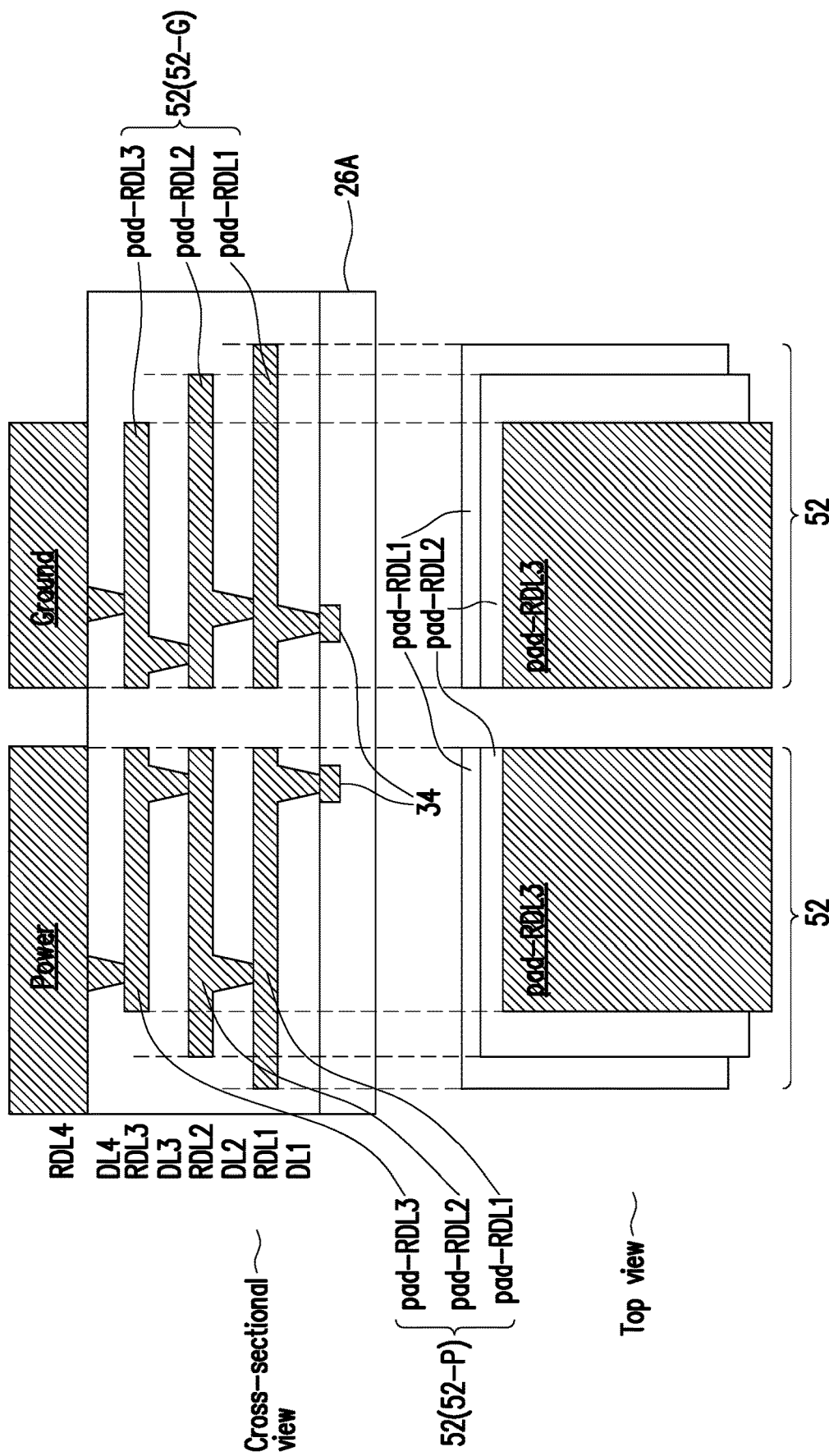
FIG. 18 illustrate power pad stacks with the power pads having misaligned edges in accordance with some embodiments.

Center region 26CR is surrounded by peripheral region 26PR, which forms a ring encircling center region 26CR. Power pad stacks 52 include the power pads in RDL layer RDL1 up to an upper RDL layer RDLn, wherein "n" may be an integer equal to 2 or greater. Power/ground pad stacks 52 also include power pads in all of the RDLs between RDL layer RDL1 and RDL layer RDLn. For example, when n is equal to 3, power/ground pad stacks 52 include the power pads in each of RDL layers RDL1, RDL2, and RDL3. Integer n is also smaller than the total number of layers of RDLs in reconstructed wafer 100 by at least 1, and may be by 2 or 3. For example, in the example as shown in FIG. 13 in which the total number of RDL layers is 6, "n" may be 5, 4, 3, or 2. FIGS. 17 and 18 illustrate some examples, wherein power/ground pad stacks 52 include a positive power pad stack 52-P and a ground power pad stack 52-G. Each of power/ground pad stacks 52 includes power pads pad-RDL1, pad-RDL2, and pad-RDL3 in RDL layers RDL1, RDL2, and RDL3, respectively.

Referring again to FIG. 15, in center region 26CR, there is no horizontal power routing besides the power pads in power/ground pad stacks 52. In accordance with some embodiments of the present disclosure, power/ground pad stacks 52 are fully separated from each other by the dielectric layers such as DL1, DL2, and DL3 as shown in FIGS. 13, 17, and 18, and there is no conductive feature between the power/ground pad stacks 52 in the center region 26CR. In the top view shown in FIG. 15, there may not be power pads in any power pad stack 52 overlapping any other power pad in other power pad stacks, and no power pad stack 52 has any edge aligned to the edge of any other power pad stack 52. Signal lines (not shown) may be distributed in peripheral region 26PR, and distributed in the spacing between neighboring package components 26 (in the top view shown in FIG. 14), so that signals may be routed from core package components 26A to IO dies 26B as shown in FIG. 14. Also, there is no signal RDLs formed between power/ground pad stacks 52.

On the right side of FIG. 15, a top view of one of power/ground pad stacks 52 is illustrated. The power pad stack 52 includes power pads pad-RDL1, pad-RDL2, and pad-RDL3 in RDL layers RDL1, RDL2, and RDL3, respectively. Throughout the description, a number is attached to the notation "pad-RDL" to show in which RDL layer the corresponding power pad is located. A power pad in a power pad stack may also be referred to without reciting the number of the respective RDL layer. For example, a power pad may be referred to as "pad-RDL1" to show that it is in RDL layer 1, or may be referred to as "pad-RDL" to show it is a pad in a power/ground pad stack. For viewing purpose, power pads pad-RDL1, pad-RDL2, and pad-RDL3 are shown as being staggered. In other embodiments, some or all of the corresponding edges of power pads pad-RDL1, pad-RDL2, and pad-RDL3 may be aligned, or shifted relative to each other, as will be discussed in subsequent paragraphs. In accordance with some embodiments, the power pads in the power/ground pad stacks 52 are solid metal pads with no holes therein. In accordance with other embodiments, degassing holes 54 may be formed in the power pads, with the degassing holes filled with dielectric materials. In FIG. 15, degassing holes 54 are shown using dashed lines to represent that they may or may not be formed. Vias (such as vias via3) are formed to interconnect the metal pads in the neighboring RDL layers. In subsequent FIGS. 16 through 37, the degassing holes 54 are not shown, while they may or may not be formed in each of these figures. In some examples, the dimensions (such as lengths, widths, diameters, etc.) of the pads in power pad stack 52 are in the range between about 20 μm and 50 μm, while the dimensions may be greater or smaller.

As shown in FIG. 13, the reconstructed wafer 100 may include a plurality of package components 26, and hence a plurality of power pads are formed for supplying power and for grounding. The lower dielectric layers such as DL1, DL2, and DL3 may be relatively thin, and also the RDLs in RDL layers RDL1, RDL2, and RDL3 are relatively narrow with relatively small spacings. Accordingly, the power redistribution line in lower dielectric layers are more likely to suffer from the problems such as electrical shorting. For example, some undesirable particles generated in the manufacturing process may short a positive power line/pad to a neighboring underlying ground line/pad if the positive power line/pad overlaps the ground line/pad, causing device failure. Accordingly, power/ground pad stacks 52 are used for vertical power/ground connection, and are not used for lateral routing of power and electrical ground. Through this design, the power distribution structure in the lower dielectric layer include individual power/ground pad stacks 52, and a positive power line/pad will not overlap any other ground line/pad, and a ground line/pad will not overlap any other positive power line/pad. The possibility of electrical shorting is reduced. On the other hand, since the upper power redistribution structure such as what is in RDL layers RDL6, RDL5 (sometimes including RDL4) are relatively wide with larger spacings, the possibility of electrical shorting is low, and these layers may be used for lateral power routing, and lateral power RDLs may be formed without forming discrete power pad stacks.

Figure 16:
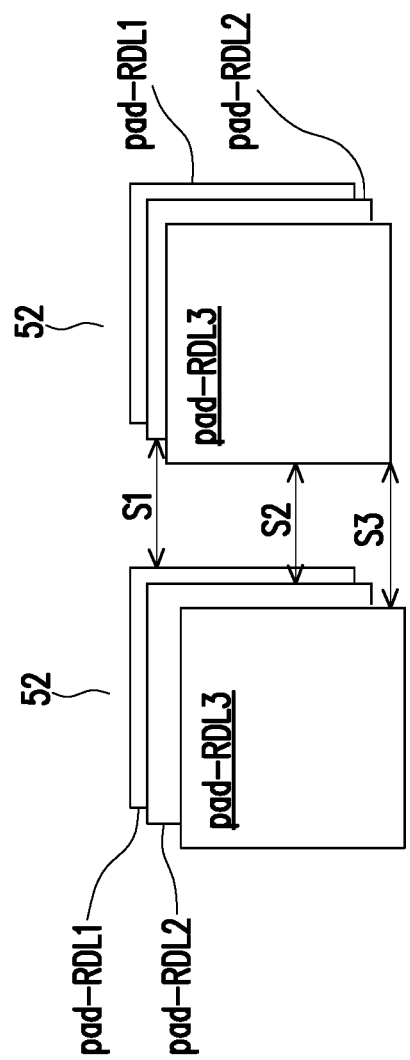
FIG. 16 illustrates the inter-layer spacings and the intra-layer spacing between the power pads in neighboring power pad stacks in accordance with some embodiments.

FIG. 16 illustrates a plane view of two neighboring power/ground pad stacks 52, with the spacings between the power pads marked. Throughout the description, the term "inter-layer spacing" is used to refer to the spacing between two power pads that are in different RDL layers, and the term "intra-layer spacing" is used to refer to the spacing between two power/ground pads that are in the same RDL layer. In the example shown in FIG. 16, spacings S1 and S2 are the inter-layer spacing of power/ground pads in two immediately neighboring layers. For example, spacing S1 is the inter-layer spacing between a power/ground pad in RDL layer RDL1 and a power/ground pad in RDL layer RDL2, and spacing S2 is the inter-layer spacing between a power/ground pad in RDL layer RDL2 and a power/ground pad in RDL layer RDL3. In accordance with some embodiments, the inter-layer spacings (such as S1 and S2) of two power pads in two immediate neighboring RDL layers and the intra-layer spacings are designed to be greater than a threshold value that the electrical shorting will not occur. For example, the particles undesirably generated in the manufacturing process may have sizes smaller than 10 µm. Accordingly, the inter-layer spacings and intra-layer spacings S1, S2, and S3 may be defined as being greater than 10 µm, so that if a particle contacts one of the power pads, the particle will not be able to contact neighboring power pads to short the power pads.

FIG. 17 illustrates two neighboring power/ground pad stacks 52. The upper part of FIG. 17 illustrates a cross-sectional view, and the lower part illustrates a top view. In some examples, one of the power/ground pad stacks 52 is a power pad stack 52-P, and the other is a ground pad stack 52-G. The edges of the upper power pads in upper RDL layers are vertically aligned to the edges of the lower power pads. As shown in the lower part of FIG. 17, the power pads in different RDLs may have the same size and the same shape, and the upper power pads may fully overlap the respective lower power pads.

FIG. 18 illustrates two neighboring power/ground pad stacks 52. The upper part of FIG. 18 illustrates a cross-sectional view, and the lower part illustrates a top view. Some or all edges of the upper power pads in upper RDL layers may be misaligned with the edges of the lower power pads, while other edges may be aligned or misaligned. As shown in the lower part of FIG. 18, the power pads in different RDLs may have different sizes and/or different shapes.

As shown in FIGS. 17 and 18, each of the power/ground pad stacks 52 is electrically connected to one of the electrical connectors 34 in the respective underlying package component 26A. There may be a one-to-one correspondence between the power/ground pad stacks 52 and the respective connecting electrical connectors 34. On the other hand, some of the electrical connectors 34 of the package component 26A may be used for signal routing, and are not connected to power/ground pad stacks 52. The signal electrical connectors 34 may be arranged in the peripheral region 26PR (FIG. 15) of the corresponding package component 26A. The electrical connectors 34 for power and grounding may be arranged in the center region 26CR of the corresponding package component 26A.

Figure 20:
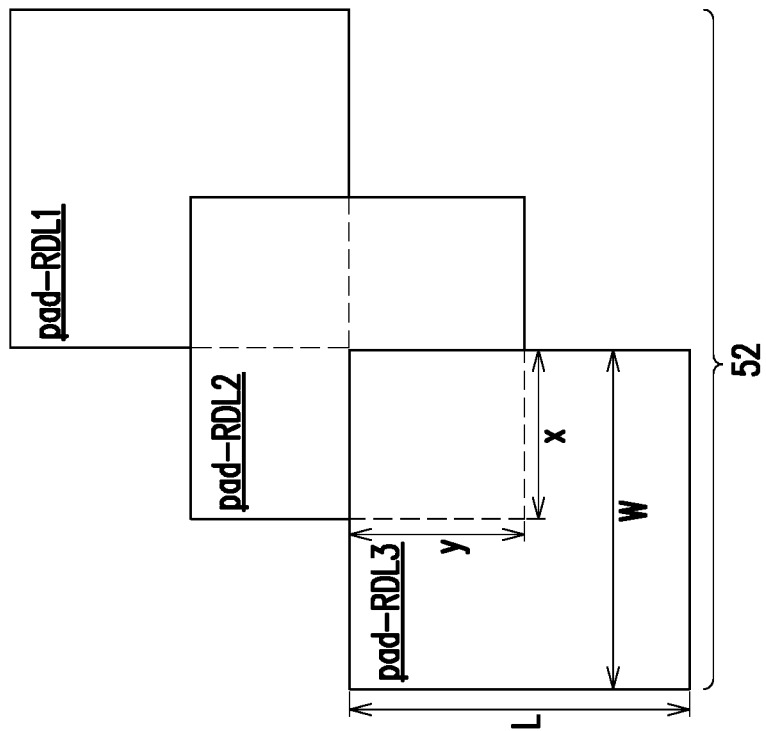
FIGS. 19 and 20 illustrate the shifting of power pads in the same power pad stack in accordance with some embodiments.
Figure 19:
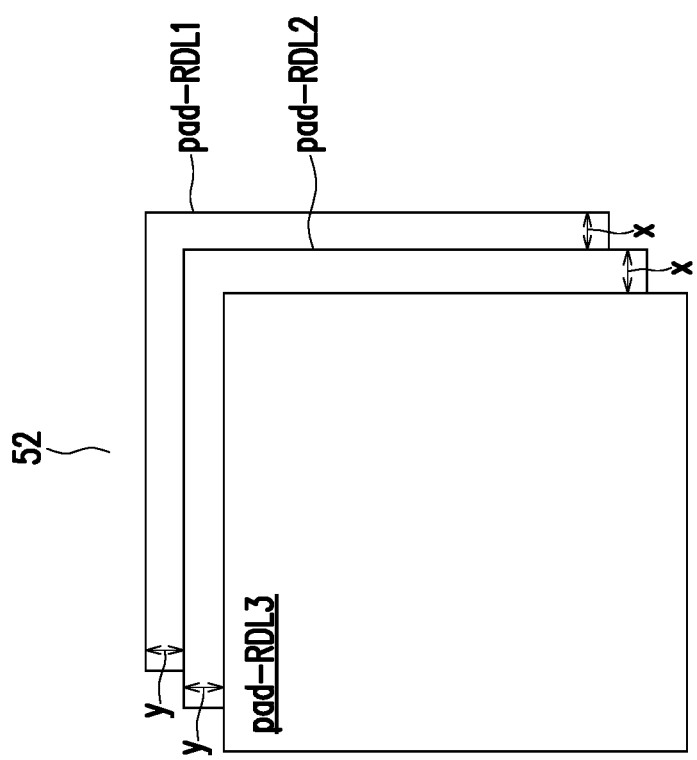

FIGS. 19 and 20 illustrate some overlapping scheme of the power pads in the same power pad stack 52. The power pads in the same power pad stack 52 may have the same top-view size and the same top-view shape, with all corresponding edges aligned. Alternatively, a power pad may partially overlap its corresponding underlying power pad(s). A power pad, however, will overlap at least a part of its immediate underlying power pad, so that a via(vias) may be formed to interconnect the power pads. FIG. 19 illustrates the overlapping of power pads in accordance with some embodiments, wherein the power pads are staggered (shifted) relative to each other to reduce stress. Each upper power pad overlaps at least a portion of each of the underlying power pads. FIG. 20 illustrates the overlapping of power pads in accordance with other embodiments, wherein the power pad pad-RDL3 overlaps the immediate underlying pad pad-RDL2, and does not overlap pad pad-RDL1, which is not immediately underlying pad-RDL3. In accordance with some embodiments, the shift "x" of a pad in width direction of the pad relative to its immediate underlying pad is smaller than or equal to W/2, wherein W is the width of the pad(s). The shift "y" of a pad in length direction of the pad relative to its immediate underlying pad is smaller than or equal to L/2, wherein L is the length of the pad(s).

Figure 22:
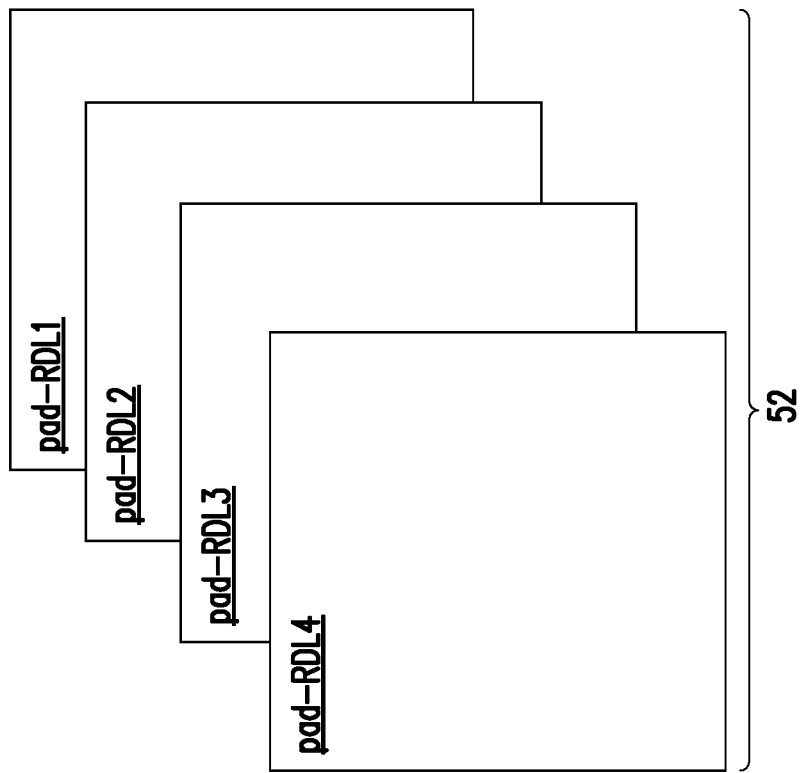
FIGS. 21 and 22 illustrate power pad stacks with different number of layers in accordance with some embodiments.
Figure 21:
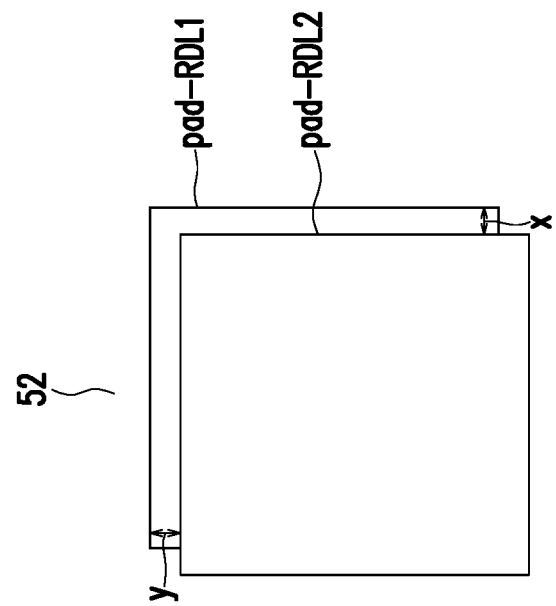

FIGS. 21 and 22 illustrate that the power/ground pad stacks 52 may extend into different number of RDL layers. In accordance with some embodiments as shown in preceding FIGS. 17 and 18, power/ground pad stacks 52 extend into RDL layers RDL1, RDL2, and RDL3. Power/ground pad stacks 52 may also extend into all RDL layers in lower redistribution structure 50A, and do not extend into any RDL layer in upper redistribution structure 50B. Since the lower redistribution structure 50A (refer to FIG. 13) are thinner and have smaller spacings between neighboring RDLs, forming the power/ground pad stacks 52 in lower redistribution structure 50A but not extending into upper redistribution structure 50B may maximize the benefit of reducing electrical shorting, which is more likely to occur in the lower redistribution structure 50A, without sacrificing the power routing ability in the upper redistribution structure 50B. FIG. 21 illustrates some embodiments, in which power/ground pad stacks 52 may extend into RDL layers RDL1 and RDL2, and do not extend into RDL layers RDL3, RDL4, RDL5, RDL6, and the like. FIG. 22 illustrates some embodiments, in which power/ground pad stacks 52 may extend into RDL layers RDL1, RDL2, RDL3, and RDL4, and do not extend into RDL layers RDL5, RDL6, and the like.

FIGS. 23, 24, and 25 illustrate that the power pads in power pad stacks may have any shapes and sizes, and the shapes and sizes of power pads in the same power pad stack may be the same or different from each other. For example, in FIG. 23, the power pads have rectangular shapes, and have the same shape and the same size. The sizes and the shapes of different power pads in the same power pad stack 52 may also be the same or different from each other. In FIG. 24, the power pads have different shapes and sizes, and the top pad pad-RDL3 has at least a portion overlapping each of the underlying power pads. In FIG. 25, the power pads have different shapes and sizes, and the top pad pad-RDL3 does not overlap any portion of pad pad-RDL1.

Figure 27:
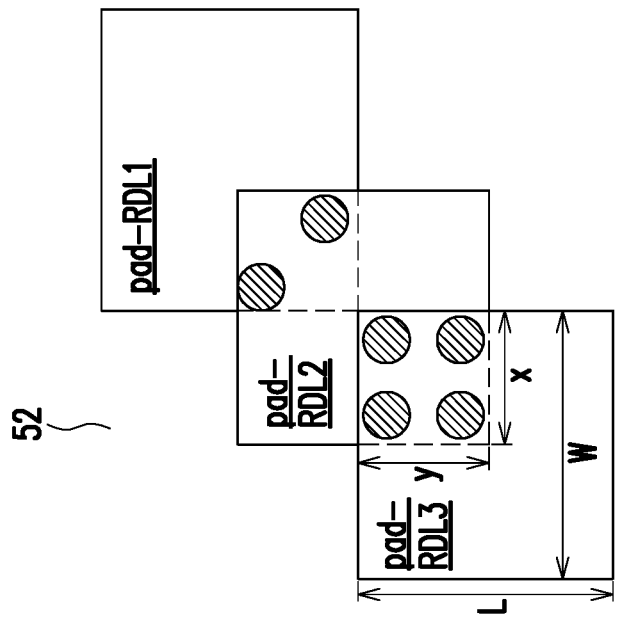
FIGS. 26 and 27 illustrate the arrangement of vias connecting the power pads in the same power pad stack in accordance with some embodiments.
Figure 26:
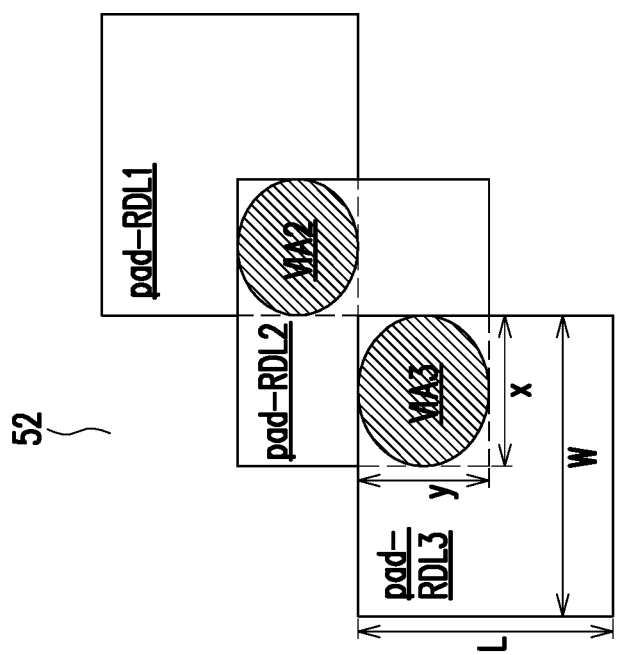

FIGS. 26 and 27 illustrate how vias are formed to interconnect neighboring power pads in the same power pad stack 52. In FIG. 26, two neighboring power pads are connected through a single via. In FIG. 27, two neighboring power pads are connected through a plurality of vias. It is appreciated that the power pads may have degassing holes (refer to degassing holes 54 in FIG. 15), and the locations and sizes of the vias are allocated to avoid the degassing holes.

Figure 29:
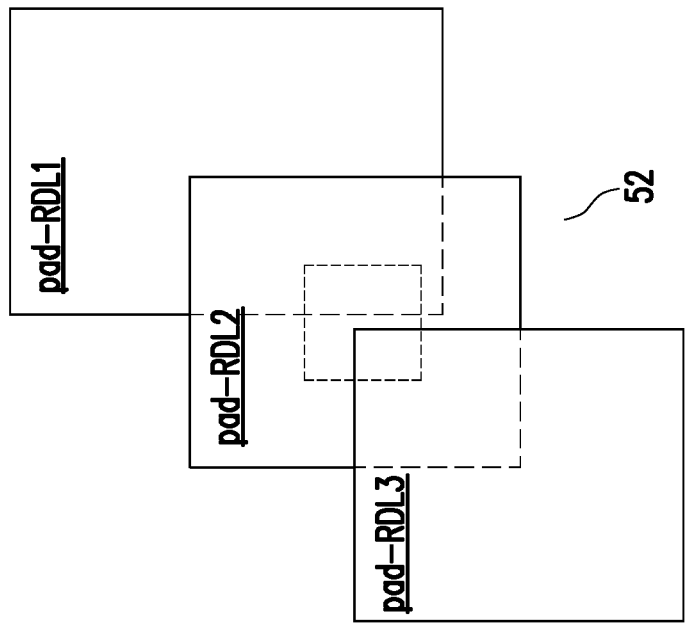
FIG. 29 illustrates that a top pad does not overlap any portion of a bottom pad in a power pad stack in accordance with some embodiments.
Figure 28:
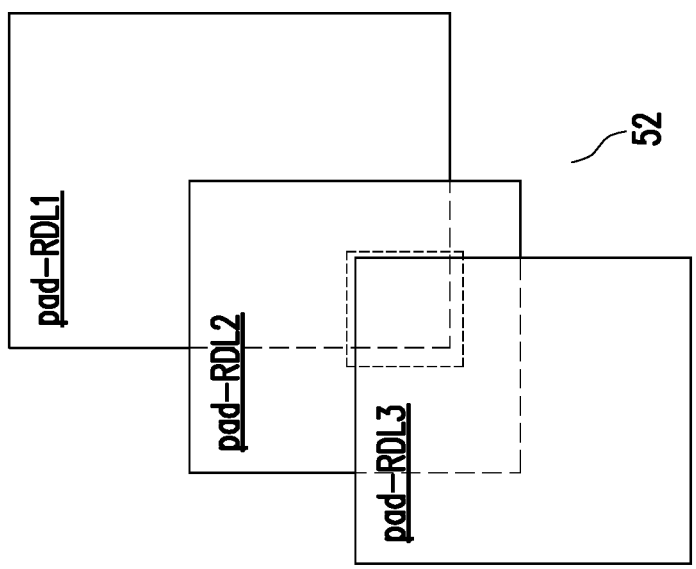
FIG. 28 illustrates that a top pad overlaps a portion of a bottom pad in a power pad stack in accordance with some embodiments.

In FIG. 28, the power pads have same or different shapes and/or same or different sizes, and the top pad pad-RDL3 has at least a portion overlapping the bottom pad pad-RDL1. In FIG. 29, the power pads also have same or different shapes and/or same or different sizes, and the top pad pad-RDL3 does not overlap any portion of pad pad-RDL1.

Figure 30:
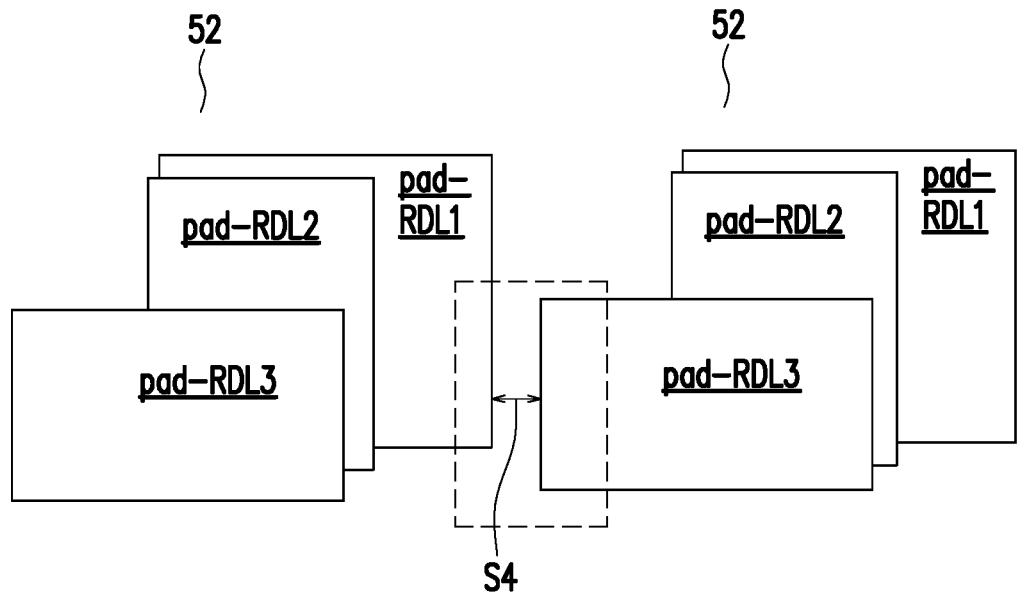
FIG. 30 illustrates that a top pad of a power pad stack does not overlap any portion of a bottom pad in a neighboring power pad stack in accordance with some embodiments.
Figure 31:
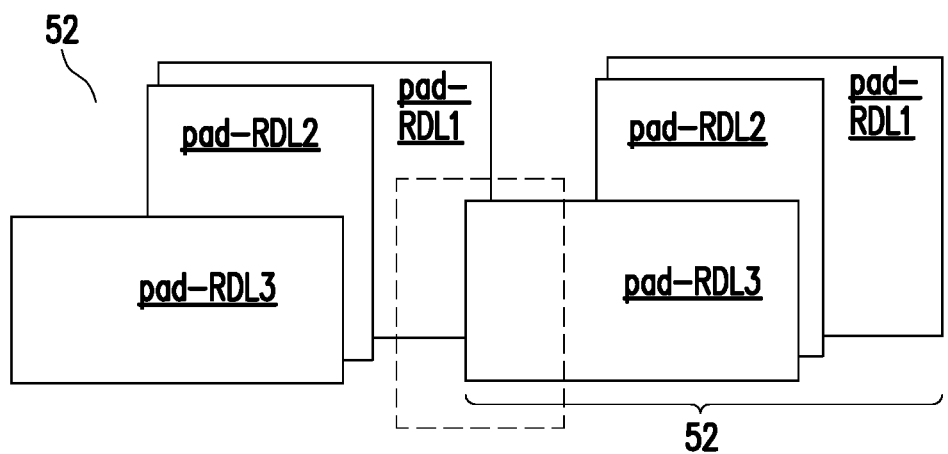
FIG. 31 illustrates that a top pad of a power pad stack overlaps a portion of a bottom pad in a neighboring power pad stack in accordance with some embodiments.

As addressed in preceding paragraphs, the inter-layer spacing of neighboring power/ground pad stacks may be greater than about 10 µm when the inter-layer spacing is between two metal pads in two immediate neighboring RDL layers. On the other hand, this restriction may be loosened when the inter-layer spacing is between two metal pads in two non-immediate neighboring RDL layers. For example, FIG. 30 illustrates that a top pad pad-RDL3 is spaced apart from the bottom pad pad-RDL1 in a neighboring power pad stack by spacing S4, which may be greater than 10 µm, equal to 10 µm, or smaller than 10 µm. FIG. 31 illustrates that a top pad pad-RDL3 overlaps the bottom pad pad-RDL1 in a neighboring power pad stack. Since the vertical spacing between the pads in non-immediate neighboring RDL layers (such as pads pad-RDL3 and pad-RDL1) is large, the risk of electrical shorting is low even if overlapping occurs.

Figure 32:
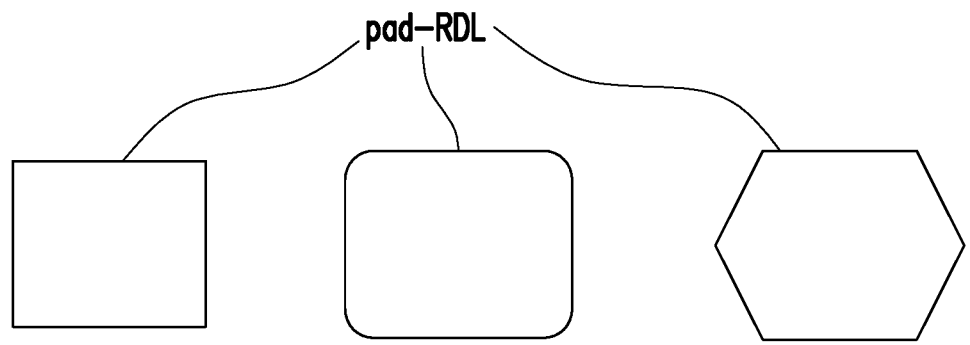
FIG. 32 illustrates some example shapes of power pads in power pad stacks in accordance with some embodiments.

FIG. 32 illustrates some example shapes of power pads in power pad stacks in accordance with some embodiments. Some example shapes include rectangles with right angles, rectangles with rounded corners, hexagons, octagons, circles, or the like.

Figure 33:
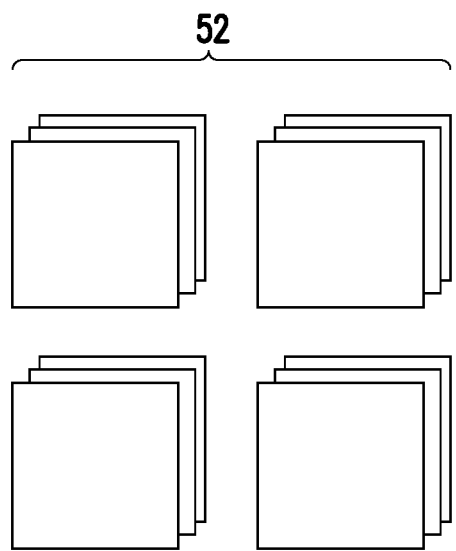
FIG. 33 illustrates power pad stacks forming an array in accordance with some embodiments.
Figure 34:
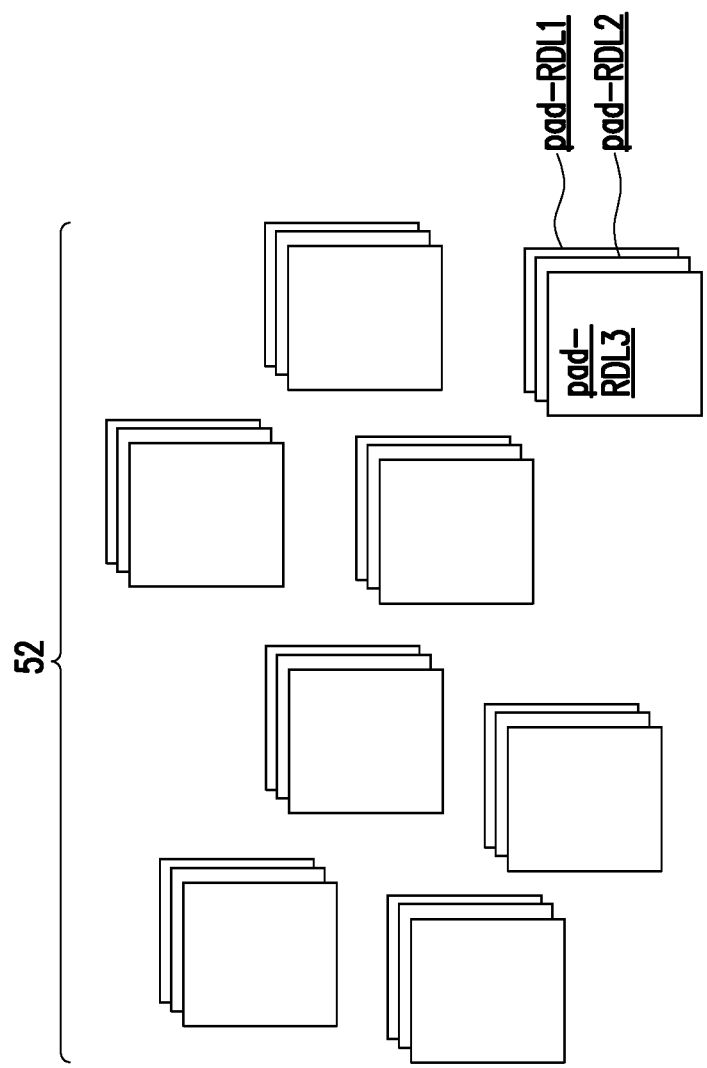
FIG. 34 illustrates power pad stacks forming a non-array repeating pattern in accordance with some embodiments.

FIGS. 33 and 34 illustrate the layout of power/ground pad stacks 52 in accordance with some embodiments. FIG. 33 illustrates an embodiment in which power/ground pad stacks 52 are arranged as an array. FIG. 34 illustrates an embodiment in which power/ground pad stacks 52 is arranged as another pattern other than array. For example, the power/ground pad stacks 52 may be arranged as having a beehive pattern or any other repeated pattern. The power/ground pad stacks 52 may also be arranged as having non-repeated patterns.

Figure 37:
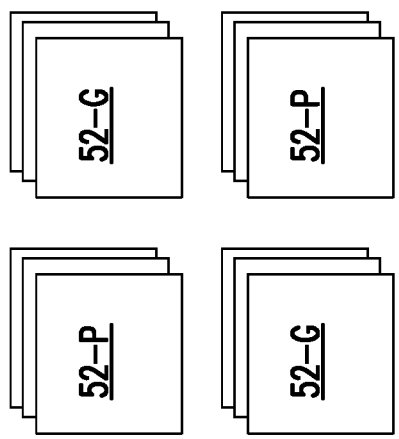
FIGS. 35, 36, and 37 illustrate the allocations of some power pad stacks in accordance with some embodiments.
Figure 36:
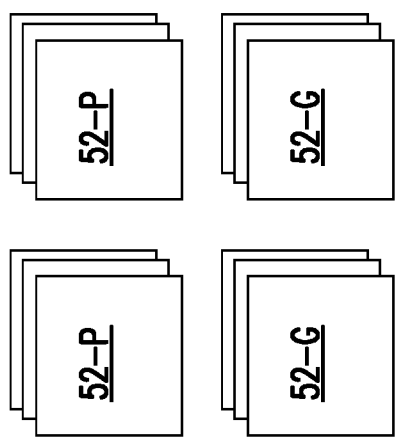
Figure 35:
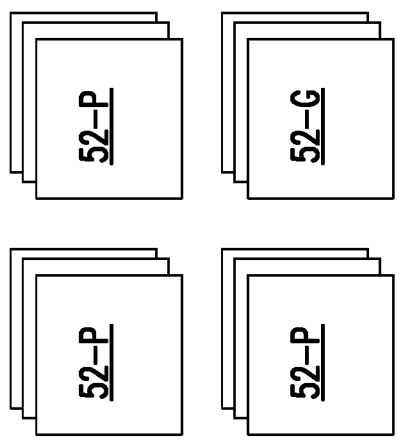

FIGS. 35, 36, and 37 illustrate the arrangements of neighboring power pad stacks. It is appreciated that whether a power pad stack is designed as a power pad stack or a ground pad stack is related to the layout of the underlying electrical connectors in the corresponding underlying package component 26A, and any layout may be adopted. For example, FIG. 35 illustrates that four neighboring power/ground pad stacks 52 have three positive power pad stacks 52-P and one ground pad stack 52-G. FIG. 36 illustrates that four neighboring power/ground pad stacks 52 have two positive power pad stacks 52-P and two ground pad stacks 52-G. FIG. 36 illustrates that four neighboring power/ground pad stacks 52 have two positive power pad stacks 52-P and two ground pad stacks 52-P, which are alternated in each row and each column.

Figure 38:
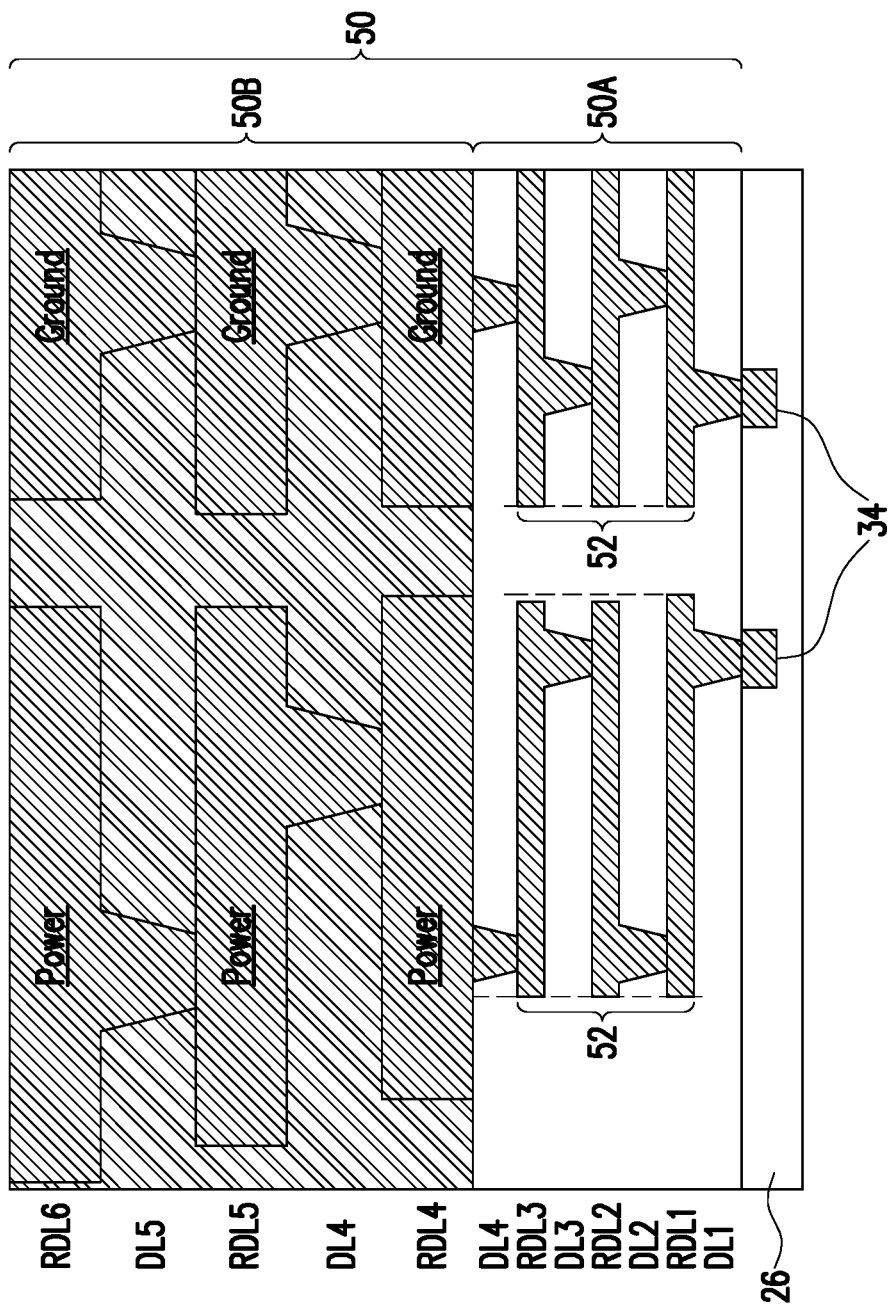
FIGS. 38 and 39 illustrate the power lines and ground lines over power pad stacks in accordance with some embodiments.
Figure 39:
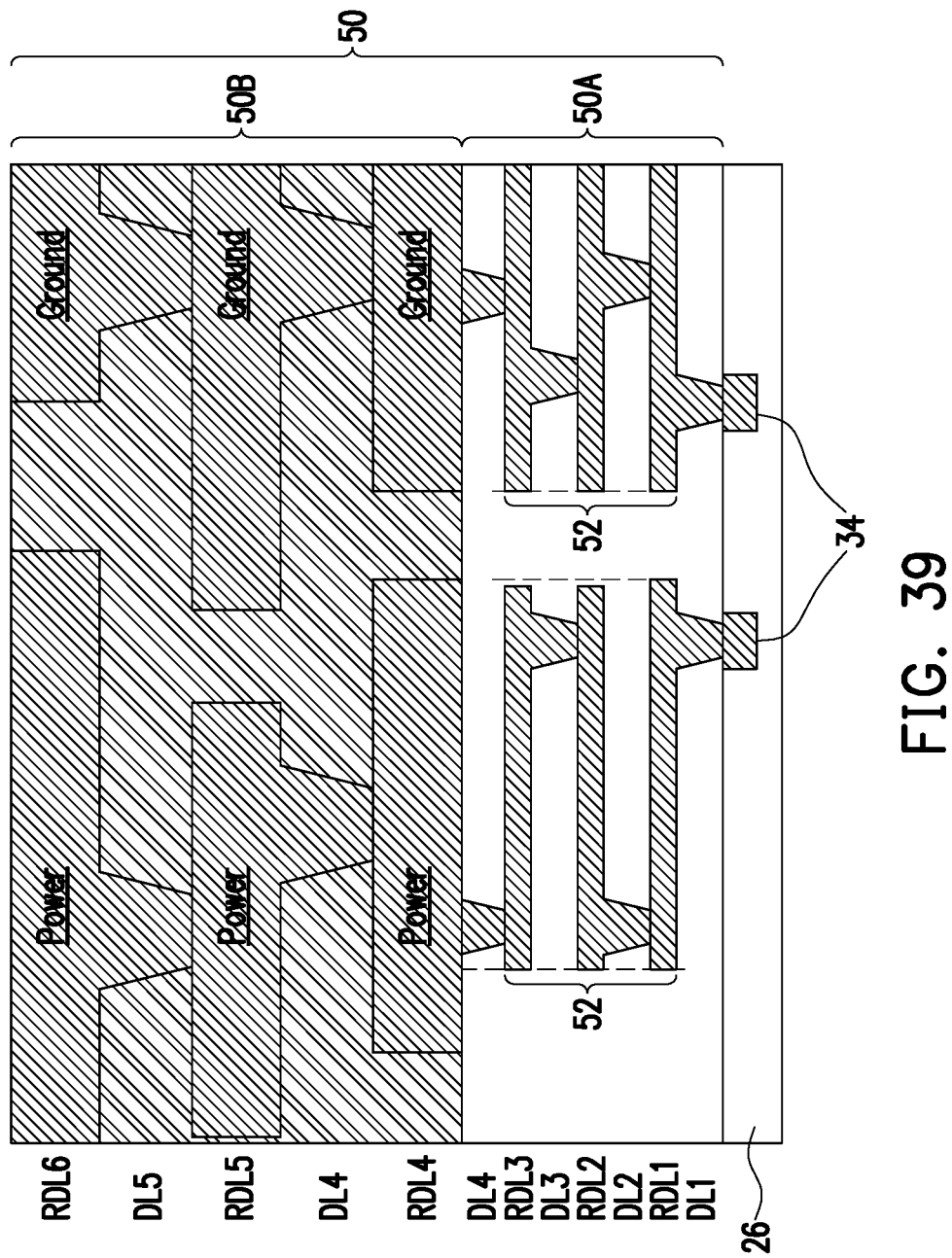

FIGS. 38 and 39 illustrate the arrangement of the metal lines/pads in upper redistribution structure 50B. FIG. 38 illustrates that some power pads and power redistribution lines in upper redistribution structure 50B may have edges aligned to the edges of the corresponding underlying power redistribution lines in upper redistribution structure 50B. For example, the power pads/lines in RDL layers RDL4 and RDL5 have their edges aligned to the edges of the corresponding underlying power pads/lines in RDL 4. In FIG. 39, the power pads and power redistribution lines in upper redistribution structure 50B may overlap the corresponding underlying power redistribution lines in upper redistribution structure 50B. For example, a power/ground pad/line in RDL layer RDL5 overlaps a neighboring power/ground pad/line in RDL layer RDL4, which neighboring power/ground pad/line in RDL layer RDL4 is connected to a power pad stack.

The embodiments of the present disclosure have some advantageous features. By forming power pad stacks in at least the lower portion of the lower redistribution structure as being discrete power/ground pad stacks 52 that are spaced apart from each other, the risk of having power shorted to electrical ground is reduced. The embodiments of the present disclosure does not incur the increase in manufacturing cost occurred since the embodiments involve the change of photo lithography masks, and do not involve the change in the manufacturing processes.

In accordance with some embodiments of the present disclosure, a method includes encapsulating a plurality of package components in an encapsulant; forming a first plurality of redistribution layers over and electrically coupling to the plurality of package components, wherein the first plurality of redistribution layers comprise a plurality of power/ground pad stacks, with each of the plurality of power/ground pad stacks having a pad in each of the first plurality of redistribution layers, and wherein the plurality of power/ground pad stacks comprise a plurality of power pad stacks; and a plurality of ground pad stacks; and forming at least one second redistribution layer over the first plurality of redistribution layers, wherein the at least one second redistribution layer comprises power lines and electrical grounding lines electrically connecting to the plurality of power/ground pad stacks. In an embodiment, the forming the first plurality of redistribution layers comprises applying a polymer layer; patterning the polymer layer to form via openings; and plating the first plurality of redistribution layers over the polymer layer, wherein vias are simultaneously plated in the via openings. In an embodiment, the forming the at least one second redistribution layer comprises forming the power lines and the electrical grounding lines; forming additional vias over and contacting the power lines and the electrical grounding lines; molding the power lines, the electrical grounding lines, and the additional vias in a molding compound; and planarizing the molding compound and the additional vias. In an embodiment, the plurality of power/ground pad stacks are directly over one of the plurality of package components, and wherein in a top view of the plurality of package components, the plurality of power/ground pad stacks are spaced part from each other. In an embodiment, the plurality of power/ground pad stacks are directly over one of the plurality of package components, and wherein in a top view of the plurality of package components, the plurality of power/ground pad stacks are arranged as an array. In an embodiment, the method further includes placing the plurality of package components over a carrier; and after the at least one second redistribution layer is formed, de-bonding the carrier from the plurality of package components. In an embodiment, the plurality of package components, the first plurality of redistribution layers, and the at least one second redistribution layer form a reconstructed wafer, and the method further comprises bonding the reconstructed wafer to an additional package component. In an embodiment, the plurality of power/ground pad stacks collectively overlap a center region of one of the plurality of package components, and the first plurality of redistribution layers are free from signal lines between the plurality of power/ground pad stacks.

In accordance with some embodiments of the present disclosure, a package includes a package component; an encapsulant encapsulating the package component therein; a first plurality of dielectric layers over the package component and the encapsulant; a first plurality of redistribution layers extending into the first plurality of dielectric layers, wherein the first plurality of redistribution layers comprise a plurality of power/ground pad stacks arranged as an array overlapping the package component, wherein the plurality of power/ground pad stacks comprise a plurality of power pad stacks and a plurality of ground pad stacks, with each of the plurality of power/ground pad stacks having a pad in each of the first plurality of redistribution layers; a second plurality of dielectric layers over the first plurality of redistribution layers; and a second plurality of redistribution layers over the first plurality of redistribution layers. In an embodiment, in a top view of the package component, the plurality of power/ground pad stacks have a same shape, and are spaced part from each other. In an embodiment, the plurality of power/ground pad stacks have spacings greater than about 10 µm. In an embodiment, in each of the plurality of power/ground pad stacks, all pads in the first plurality of redistribution layers have a same shape, and are vertically aligned to each other. In an embodiment, the first plurality of dielectric layers are formed of polymers, and the second plurality of dielectric layers are formed of molding compounds. In an embodiment, the first plurality of dielectric layers have three or more layers. In an embodiment, no signal line is between the plurality of power/ground pad stacks.

In accordance with some embodiments of the present disclosure, a package includes a plurality of package components, wherein the plurality of package components comprise device dies; a molding compound encapsulating the plurality of package components therein; a first plurality of redistribution layers over and electrically connecting to the plurality of package components, wherein the first plurality of redistribution layers comprise a plurality of metal pad arrays, with each of the metal pad arrays overlapping a center region of one of the plurality of package components, and wherein each of the plurality of metal pad arrays comprises a plurality of power/ground pad stacks; and a second plurality of redistribution layers over and electrically connecting to the first plurality of redistribution layers. In an embodiment, a power/ground pad stack in one of the metal pad arrays comprises a plurality of metal pads electrically interconnected, and wherein the plurality of metal pads are electrically connected to a power pad or an electrical ground pad in a respectively underlying package component. In an embodiment, upper pads in the power/ground pad stack fully overlap corresponding lower pads in the power/ground pad stack. In an embodiment, the plurality of metal pads in the power/ground pad stack are staggered. In an embodiment, neighboring power/ground pad stacks in one of the metal pad arrays have spacings greater than about 10 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
placing a plurality of package components over a carrier;
encapsulating the plurality of package components in an encapsulant;
forming a first plurality of redistribution layers over and electrically coupling to the plurality of package components, wherein the first plurality of redistribution layers comprise a plurality of power/ground pad stacks, with each of the plurality of power/ground pad stacks having a pad in each of the first plurality of redistribution layers, and wherein the plurality of power/ground pad stacks comprise:
a plurality of power pad stacks; and
a plurality of ground pad stacks;
forming at least one second redistribution layer over the first plurality of redistribution layers, wherein the at least one second redistribution layer comprises power lines and electrical grounding lines electrically connecting to the plurality of power/ground pad stacks; and
after the at least one second redistribution layer is formed, de-bonding the carrier from the plurality of package components.

2. The method of claim 1, wherein the forming the first plurality of redistribution layers comprises:
applying a polymer layer;
patterning the polymer layer to form via openings; and
plating the first plurality of redistribution layers over the polymer layer, wherein vias are simultaneously plated in the via openings.

3. The method of claim 1, wherein the forming the at least one second redistribution layer comprises:
forming the power lines and the electrical grounding lines;
forming additional vias over and contacting the power lines and the electrical grounding lines;
molding the power lines, the electrical grounding lines, and the additional vias in a molding compound; and
planarizing the molding compound and the additional vias.

4. The method of claim 1, wherein the plurality of power/ground pad stacks are directly over one of the plurality of package components, and wherein in a top view of the plurality of package components, the plurality of power/ground pad stacks are spaced part from each other.

5. The method of claim 1, wherein the plurality of power/ground pad stacks are directly over one of the plurality of package components, and wherein in a top view of the plurality of package components, the plurality of power/ground pad stacks are arranged as an array.

6. The method of claim 1, wherein the plurality of package components, the first plurality of redistribution layers, and the at least one second redistribution layer form a reconstructed wafer, and the method further comprises bonding the reconstructed wafer to an additional package component.

7. The method of claim 1, wherein the plurality of power/ground pad stacks collectively overlap a center region of one of the plurality of package components, and the first plurality of redistribution layers are free from signal lines between the plurality of power/ground pad stacks.

8. The method of claim 1, wherein each of the plurality of power pad stacks and the plurality of power pad stacks comprises a plurality of metal pads, each in a dielectric layer, and wherein upper ones of the plurality of metal pads overlap corresponding lower ones of the plurality of metal pads.

9. A package comprising:
a package component;
an encapsulant encapsulating the package component therein;
a first plurality of dielectric layers over the package component and the encapsulant, wherein the first plurality of dielectric layers are formed of polymers;
a first plurality of redistribution layers extending into the first plurality of dielectric layers, wherein the first plurality of redistribution layers comprise a plurality of power/ground pad stacks arranged as an array overlapping the package component, wherein the plurality of power/ground pad stacks comprise a plurality of power pad stacks and a plurality of ground pad stacks, with each of the plurality of power/ground pad stacks having a pad in each of the first plurality of redistribution layers;

a second plurality of dielectric layers over the first plurality of redistribution layers, wherein the second plurality of dielectric layers are formed of molding compounds; and a second plurality of redistribution layers over the first plurality of redistribution layers.

10. The package of claim 9, wherein in a top view of the package component, the plurality of power/ground pad stacks have a same shape, and are spaced part from each other.

11. The package of claim 10, wherein the plurality of power/ground pad stacks have spacings greater than about 10 μm.

12. The package of claim 9, wherein in each of the plurality of power/ground pad stacks, all pads in the first plurality of redistribution layers have a same shape, and are vertically aligned to each other.

13. The package of claim 9, wherein the first plurality of dielectric layers have three or more layers.

14. The package of claim 9, wherein no signal line is between the plurality of power/ground pad stacks.

15. A package comprising:
a plurality of package components, wherein the plurality of package components comprise device dies;
a molding compound encapsulating the plurality of package components therein;
a first plurality of redistribution layers over and electrically connecting to the plurality of package components, wherein the first plurality of redistribution layers comprise a plurality of metal pad arrays, with each of the metal pad arrays overlapping a center region of one of the plurality of package components, and wherein each of the plurality of metal pad arrays comprises a plurality of power/ground pad stacks, and metal pads in the plurality of power ground pad stacks are staggered with each of an upper metal pad in each of the plurality of power/ground pad stacks comprising a first part overlapping a part of a corresponding lower metal pad in the each of the plurality of power/ground pad stacks, and a second part extending beyond edges of the corresponding lower metal pad; and
a second plurality of redistribution layers over and electrically connecting to the first plurality of redistribution layers.

16. The package of claim 15, wherein a power/ground pad stack in one of the metal pad arrays comprises a plurality of metal pads electrically interconnected, and wherein the plurality of metal pads are electrically connected to a power pad or an electrical ground pad in a respectively underlying package component.

17. The package of claim 15, wherein all metal pads in the each of the plurality of power/ground pad stacks have a same size and a same shape.

18. The package of claim 15, wherein neighboring power/ground pad stacks in one of the metal pad arrays have spacings greater than about 10 μm.

19. The package of claim 15, wherein no signal lines are routed in the plurality of metal pad arrays.

* * * * *